US012761418B2

(12) United States Patent
Rusu et al.

(10) Patent No.: US 12,761,418 B2
(45) Date of Patent: Oct. 13, 2026

(54) OPTICAL PACKAGING

(71) Applicant: Taiwan Semiconductor Manufacturing Company, Ltd., Hsin-Chu (TW)

(72) Inventors: Stefan Rusu, Sunnyvale, CA (US); Lan-Chou Cho, Hsinchu City (TW); Ming Yang Jung, Kaohsiung City (TW); Tai-Chun Huang, New Taipei City (TW); You-Cheng Lu, Tainan City (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 470 days.

(21) Appl. No.: 18/332,171

(22) Filed: Jun. 9, 2023

(65) Prior Publication Data

US 2024/0411084 A1 Dec. 12, 2024

(51) Int. Cl.
*G02B 6/12* (2006.01)
*G02B 6/13* (2006.01)
(Continued)

(52) U.S. Cl.
CPC ........... *G02B 6/12002* (2013.01); *G02B 6/13* (2013.01); *H01L 25/18* (2013.01); *H01L 25/50* (2013.01);
(Continued)

(58) Field of Classification Search
CPC .............. G02B 6/12002; H01L 23/538; H01L 2225/06541
See application file for complete search history.

(56) References Cited

U.S. PATENT DOCUMENTS 10,866,440 B1 12/2020 Cho et al.
10,976,489 B2 4/2021 Jou et al.
(Continued)

FOREIGN PATENT DOCUMENTS

KR 20210116202 A 9/2021
KR 20220000339 A 1/2022
(Continued)

*Primary Examiner* — Charlie Y Peng
(74) *Attorney, Agent, or Firm* — HAYNES AND BOONE, LLP

(57) ABSTRACT

An exemplary package includes a photonic die, an electronic die, and a package component. The electronic die has an electronic device layer disposed between a frontside interconnect structure and a backside interconnect structure. The backside interconnect structure is configured to deliver power to the electronic device layer. The photonic die, the electronic die, and the package component are stacked top-to-bottom. The backside interconnect structure of the electronic die is connected to the package component, and the photonic die is connected to the electronic die. In some embodiments, the photonic die and the electronic die are each free of through semiconductor vias, such as through silicon vias. In some embodiments, a frontside interconnect structure of the photonic die is connected to the frontside interconnect structure of the electronic die. In some embodiments, a backside interconnect structure of the photonic die is connected to the frontside interconnect structure of the electronic die.

20 Claims, 17 Drawing Sheets

(51) Int. Cl.

| | |
|---|---|
| ***H01L 25/00*** | (2006.01) |
| ***H01L 25/18*** | (2023.01) |
| *H01L 23/00* | (2006.01) |
| *H01L 23/528* | (2006.01) |

(52) U.S. Cl.

CPC .......... *H01L 23/5286* (2013.01); *H01L 24/13* (2013.01); *H01L 24/16* (2013.01); *H01L 24/17* (2013.01); *H01L 2224/13111* (2013.01); *H01L 2224/13124* (2013.01); *H01L 2224/13139* (2013.01); *H01L 2224/13144* (2013.01); *H01L 2224/13147* (2013.01); *H01L 2224/13155* (2013.01); *H01L 2224/13164* (2013.01); *H01L 2224/16145* (2013.01); *H01L 2224/16225* (2013.01); *H01L 2224/1703* (2013.01); *H01L 2224/17181* (2013.01)

(56) References Cited

U.S. PATENT DOCUMENTS

| | | | | |
|---|---|---|---|---|
| 11,215,753 | B2 | 1/2022 | Islam et al. | |
| 11,315,855 | B2 | 4/2022 | Chen et al. | |
| 11,404,404 | B2 | 8/2022 | Chen et al. | |
| 11,417,596 | B2 | 8/2022 | Song et al. | |
| 11,527,419 | B2 | 12/2022 | Yu et al. | |
| 11,762,155 | B2 * | 9/2023 | Patel | G02B 6/423 385/14 |
| 2016/0085038 | A1 * | 3/2016 | Decker | G02B 6/428 385/14 |
| 2018/0275359 | A1 * | 9/2018 | Ding | H01L 24/81 |
| 2019/0165019 | A1 * | 5/2019 | Wang | H04N 23/54 |
| 2021/0096310 | A1 * | 4/2021 | Chang | H01L 24/19 |
| 2022/0099887 | A1 | 3/2022 | Yu et al. | |
| 2022/0283387 | A1 * | 9/2022 | Rusu | G02B 6/122 |
| 2022/0373734 | A1 * | 11/2022 | Duong | H01L 21/4853 |
| 2022/0381978 | A1 | 12/2022 | Chang et al. | |
| 2022/0382003 | A1 | 12/2022 | Yu et al. | |
| 2022/0392881 | A1 | 12/2022 | Yu et al. | |
| 2023/0060862 | A1 | 3/2023 | Patel et al. | |
| 2023/0103713 | A1 | 4/2023 | Lin et al. | |

FOREIGN PATENT DOCUMENTS

| | | | |
|---|---|---|---|
| TW | 202114087 | A | 4/2021 |
| TW | 202217376 | A | 5/2022 |
| TW | 202247409 | A | 12/2022 |

* cited by examiner

OPTICAL PACKAGING

Advanced packaging technologies have been developed to reduce density and/or improve performance of integrated circuits (ICs). For example, packaging has evolved by vertically stacking multiple chips/dies in so-called three-dimensional ("3D") packages, or 2.5D packages (which use an interposer). Through semiconductor via (TSV), such as through silicon via, is one technique for electrically and/or physically connecting stacked chips/dies. As photonic (optical) dies and electronic dies are integrated into packages to provide low power, high speed technology platforms, such as those needed for Big Data and artificial intelligence applications, TSVs have introduced reliability and cost issues into packaging. Accordingly, although existing packaging and/or packaging interconnect techniques have been generally adequate for their intended purposes, they have not been entirely satisfactory in all respects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
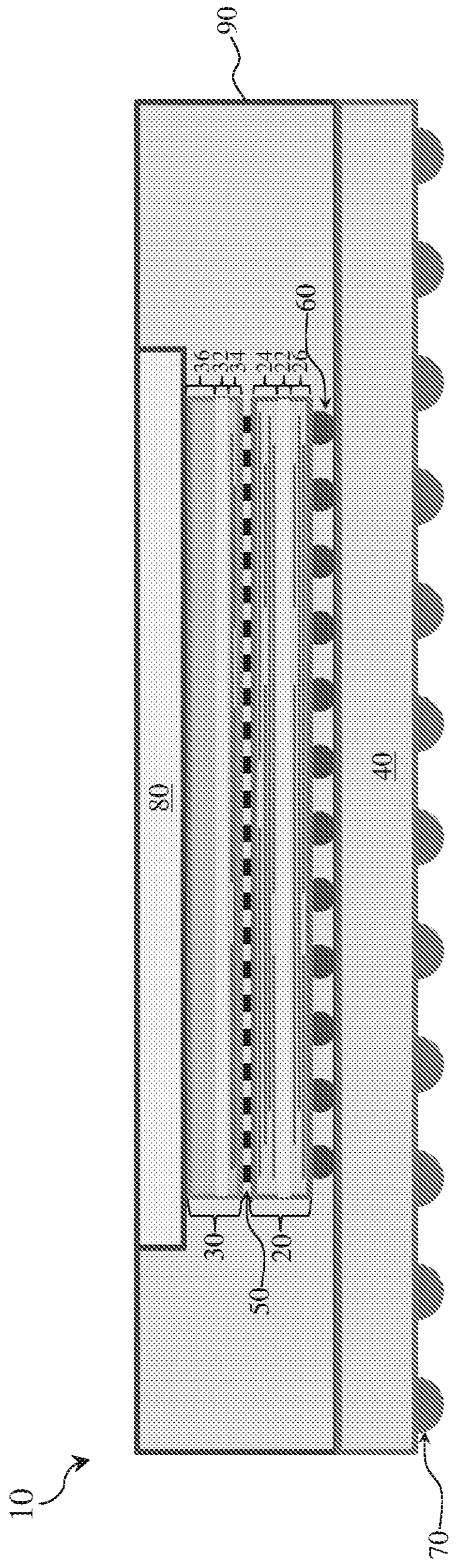
FIG. 1 is a diagrammatic cross-sectional view of a package, in portion or entirety, according to various aspects of the present disclosure.

The present disclosure relates generally to packaging, and more particularly, to packaging techniques that integrate photonic (optical) dies and electronic dies.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact. In addition, spatially relative terms, for example, "lower." "upper." "horizontal," "vertical," "above," "over," "below," "beneath," "up," "down," "top," "bottom," etc. as well as derivatives thereof (e.g., "horizontally." "downwardly," "upwardly," etc.) are used for ease of the present disclosure of one features relationship to another feature. The spatially relative terms are intended to cover different orientations of the device including the features. Furthermore, when a number or a range of numbers is described with "about," "approximate." and the like, the term is intended to encompass numbers that are within a reasonable range considering variations that inherently arise during manufacturing as understood by one of ordinary skill in the art. For example, the number or range of numbers encompasses a reasonable range including the number described, such as within +/−10% of the number described, based on known manufacturing tolerances associated with manufacturing a feature having a characteristic associated with the number. For example, a material layer having a thickness of "about 5 nm" can encompass a dimension range from 4.5 nm to 5.5 nm where manufacturing tolerances associated with depositing the material layer are known to be +/−10% by one of ordinary skill in the art. Still further, the present disclosure may repeat reference numerals and/or letters in the various examples. This repetition is for the purpose of simplicity and clarity and does not in itself dictate a relationship between the various embodiments and/or configurations discussed.

Through semiconductor via (TSV), such as through silicon via, is one technique for electrically and/or physically connecting stacked chips/dies. As photonic (optical) dies and electronic dies are integrated into packages to provide low power, high speed technology platforms, such as those needed for Big Data and artificial intelligence applications, TSVs have introduced reliability and cost issues into packaging. For example, different coefficients of thermal expansion between TSVs and their surrounding structures can introduce thermal stress into packages that can cause cracking of the dies thereof. Further, complexity of fabricating TSVs in a manner that minimizes damage to dies and/or structures thereof is costly.

To address these challenges, packages are disclosed herein having electronic dies with dual-sided interconnect structures, where backside interconnect structures of the electronic dies are configured to deliver power to electronic devices (e.g., transistors) and/or components of the electronic devices of the electronic dies. Configuring the electronic dies with backside power delivery structures enables stacking of photonic dies on top of the electronic dies, along with elimination of TSVs from the photonic dies and/or the electronic dies that typically facilitate power delivery to the electronic dies. Packages described herein, which have die stacks having electronic dies and photonic dies without TSV power delivery structures, exhibit improved reliability, along with reduced fabrication costs and/or complexity. Different embodiments may have different advantages, and no particular advantage is required of any embodiment.

Figure 2:
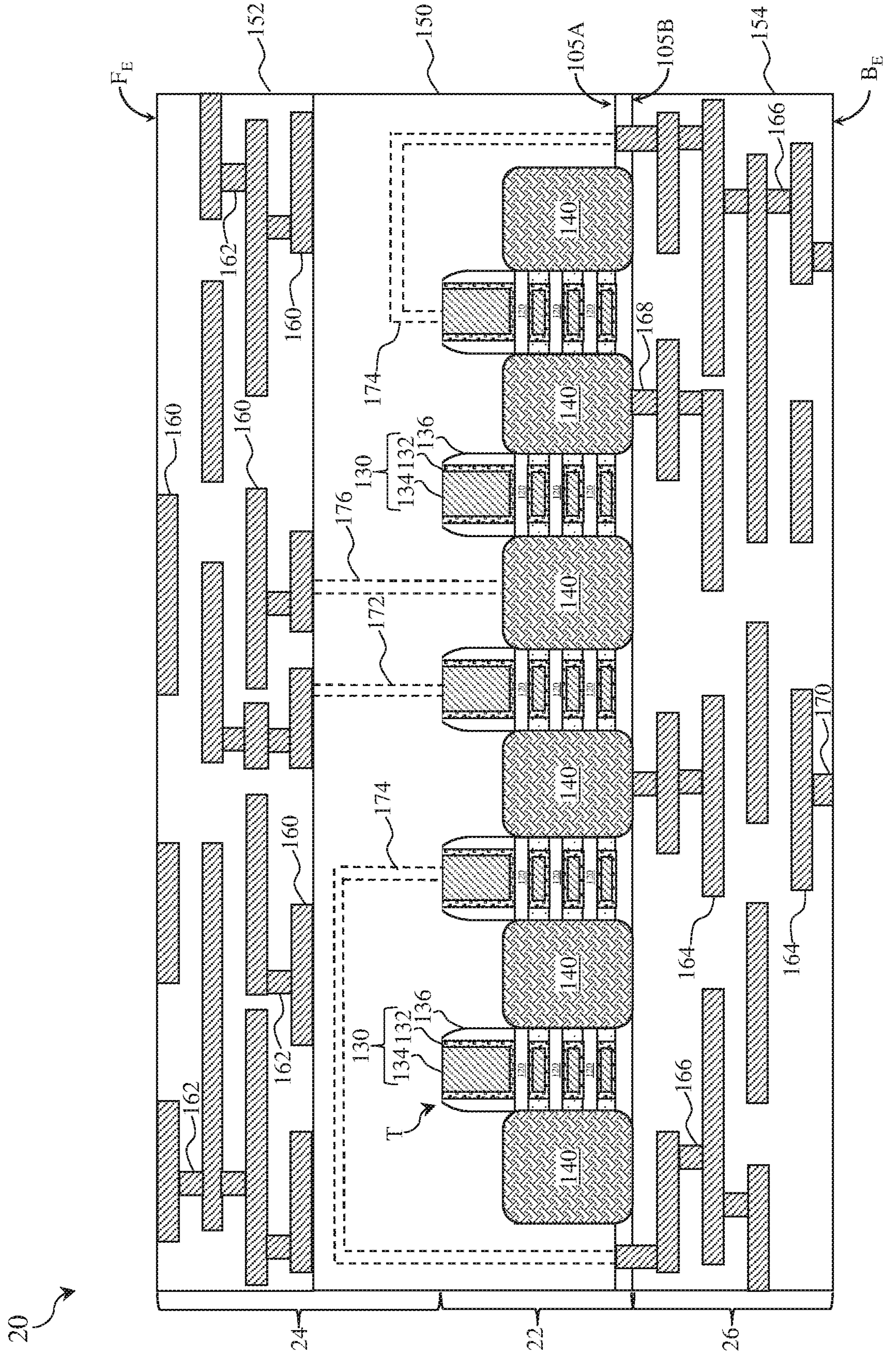
FIG. 2 is a diagrammatic cross-sectional view of an electronic die, in portion or entirety, that can be included in a package according to various aspects of the present disclosure.
Figure 3A:
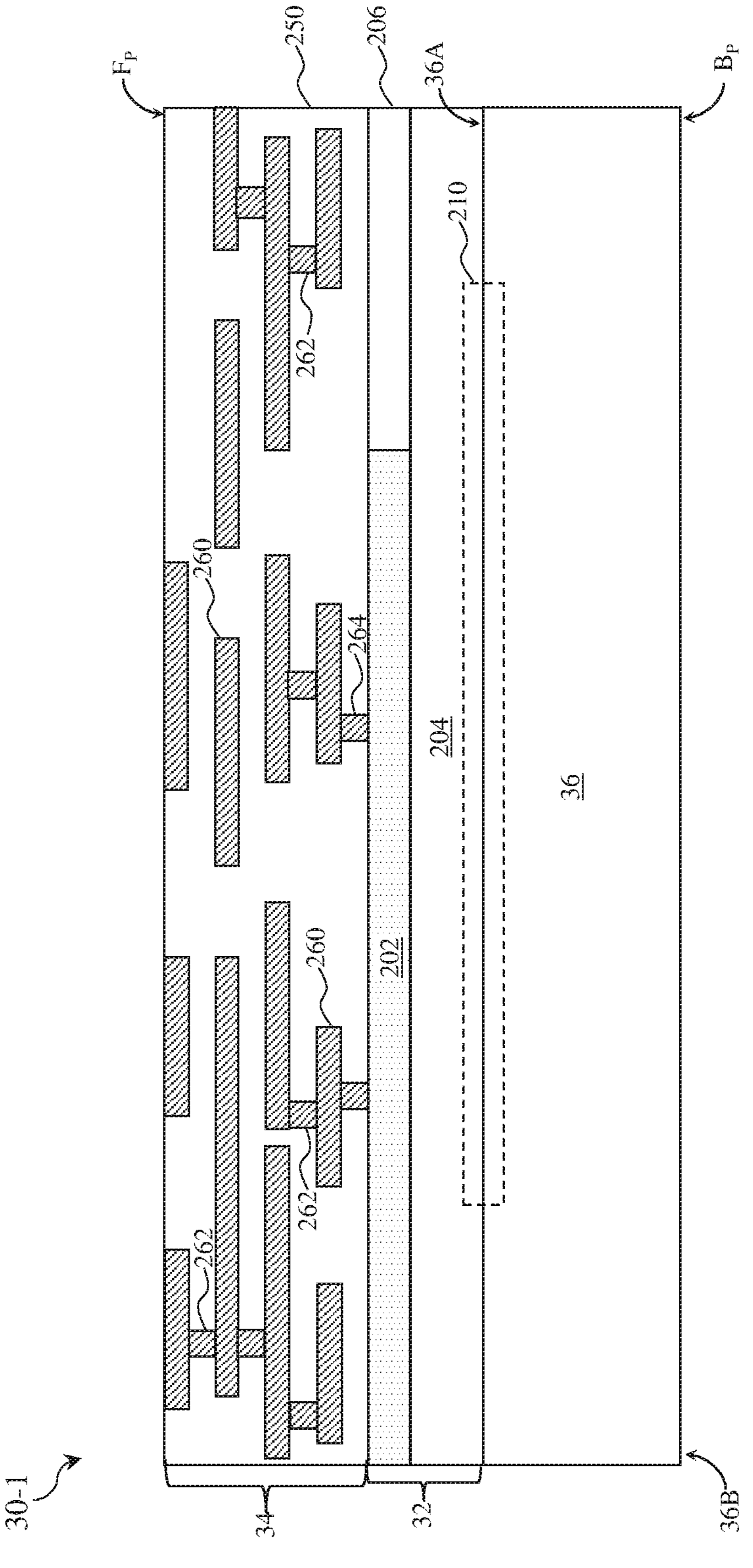
FIG. 3A is a diagrammatic cross-sectional view of a photonic die, in portion or entirety, that can be included in a package according to various aspects of the present disclosure.

FIG. 1 is a diagrammatic cross-sectional view of a package 10, in portion or entirety, according to various aspects of the present disclosure. FIG. 2 is a diagrammatic cross-sectional view of an electronic die 20, in portion or entirety, that can be included in package 10 according to various aspects of the present disclosure. FIG. 3A is a diagrammatic cross-sectional view of a photonic die 30-1, in portion or entirety, that can be included in package 10 according to various aspects of the present disclosure. In FIG. 1, package 10 includes electronic die 20 (having a device layer 22 disposed between an interconnect structure 24 and an interconnect structure 26), photonic die 30 configured as photonic die 30-1 (having a device layer 32 disposed between an interconnect structure 34 and a substrate 36), a package component 40, connectors 50, connectors 60, connectors 70, a thermal structure 80, and an encapsulant 90. FIG. 1, FIG. 2, and FIG. 3A are discussed concurrently herein for ease of description and understanding. FIG. 1, FIG. 2, and FIG. 3A have been simplified for the sake of clarity to better understand the inventive concepts of the present disclosure. Additional features can be added in package 10, electronic die 20, photonic die 30, photonic die 30-1, or a combination thereof, and some of the features described below can be replaced, modified, or eliminated in other embodiments of package 10, electronic die 20, photonic die 30, photonic die 30-1, or a combination thereof.

Electronic die 20 (also referred to as an e-die or an electronic IC (EIC)) is configured to receive electrical signals, transmit electrical signals, process electrical signals, communicate with other components and/or dies of package 10 (e.g., by transmitting and/or receiving electrical signals to and/or from photonic die 30 and/or package component 40), or a combination thereof. Electronic die 20 includes a functional IC formed from electronic components. The functional IC can be configured to perform a logic function, a memory function, a digital function, an analog function, a mixed signal function, a radio frequency (RF) function, an input/output (I/O) function, a communications function, a power management function, other function, or a combination thereof. In some embodiments, electronic die 20 is a central processing unit (CPU) chip, a graphics processing unit (GPU) chip, an application specific IC (ASIC), a system-on-chip (SoC), a high-performance computing (HPC) chip, a memory chip, a high-bandwidth memory (HBM) chip, other suitable type of electronic chip, or a combination thereof.

Referring to FIG. 2, as noted, electronic die 20 has device layer 22 disposed between interconnect structure 24 and interconnect structure 26. Device layer 22 can include circuitry fabricated by front-end-of-line (FEOL) processing. The circuitry can include electronic devices, such as resistors, capacitors, inductors, diodes, p-type field effect transistors (PFETs), n-type FETs (NFETs), metal-oxide-semiconductor FETs (MOSFETs), complementary MOS (CMOS) transistors, bipolar junction transistors (BJTs), laterally diffused MOS (LDMOS) transistors, high voltage transistors, high frequency transistors, other suitable components, or a combination thereof. The transistors can be planar transistors and/or non-planar transistors, such as fin-like FETs (FinFETs) or gate-all-around (GAA) transistors. In some embodiments, device layer 22 includes stacked transistor structures, such as complementary FETs (CFETs).

The various electronic devices can be configured to provide functionally distinct regions of an IC, such as a logic region (i.e., a core region), a memory region, an analog region, a peripheral region (e.g., an I/O region), a dummy region, other region, or a combination thereof. The logic region can be configured with standard cells, each of which can provide a logic device and/or a logic function, such as an inverter, an AND gate, an NAND gate, an OR gate, an NOR gate, a NOT gate, an XOR gate, an XNOR gate, other logic device/function, or a combination thereof. The memory region can be configured with memory cells, each of which can provide a storage device and/or storage function, such as flash memory, non-volatile random-access memory, static random-access memory, dynamic random-access memory, other volatile memory, other non-volatile memory, other storage device/function, or a combination thereof. In some embodiments, logic cells include transistors and interconnect structures that combine to provide logic devices/functions. In some embodiments, memory cells include transistors and interconnect structures that combine to provide storage devices/functions.

In some embodiments, device layer 22 includes device components, such as a substrate 105, doped regions/wells (e.g., n-wells and/or p-wells), channels 120 disposed over and/or within substrate 105, isolation features (e.g., shallow trench isolation (STI) structures and/or other suitable isolation structures), gate stacks 130 (e.g., gate dielectrics 132 and gate electrodes 134), gate spacers 136 along sidewalls of gate stacks 130, source/drain features (e.g., epitaxial source/drains 140), other device components/features, or a combination thereof. In the depicted embodiment, device layer 22 includes transistors T having respective channel layers 120 suspended over substrate 105 and extending between respective epitaxial source/drains 140, where gate stacks 130 of transistors T are disposed on and surround respective channel layers 120. In such embodiments, transistors T are GAA transistors. In some embodiments, the GAA transistors are fork-sheet transistors, such as where the gate stacks wrap suspended channel layers (e.g., a gate stack is disposed on a top, a bottom, and a sidewall of a channel layer). In some embodiments, device layer 22 includes a planar transistor, where a channel of the planar transistor is formed in a semiconductor substrate between respective source/drains and a respective gate stack is disposed on the channel (e.g., on a portion of the semiconductor substrate in which the channel is formed). In some embodiments, device layer 22 includes a non-planar transistor having a channel formed in a semiconductor fin that extends from the semiconductor substrate and between respective source/drains on/in the semiconductor fin, where a respective gate stack is disposed on and wraps the channel of the semiconductor fin (i.e., the non-planar transistor is a FinFET). The various transistors of device layer 22 can be configured as planar transistors and/or non-planar transistors depending on design requirements.

Substrate 105 has a surface 105A and a surface 105B, where a thickness of substrate 105 is along a z-direction between surface 105A and surface 105B. Surface 105A is opposite surface 105B, and in the depicted embodiment, transistors T and/or other electronic devices are formed over surface 105A. In some embodiments, surface 105A and surface 105B are a top surface (also referred to as a front surface or a frontside) and a bottom surface (also referred to as a back surface or a backside), respectively, of substrate 105. In some embodiments, surface 105A and surface 105B are an active surface and a non-active surface, respectively, of substrate 105 (i.e., electronic devices are formed over and/or on the active surface but not the non-active surface). Substrate 105 can be a bulk semiconductor substrate formed from an elementary semiconductor, such as silicon and/or germanium; a compound semiconductor, such as silicon carbide, gallium arsenide, gallium phosphide, indium phosphide, indium arsenide, indium antimonide, or a combination thereof; an alloy semiconductor, such as SiGe, GaAsP, AlInAs, AlGaAs, GaInAs, GaInP, GaInAsP, or a combination thereof; or a combination thereof. For example, substrate 105 is a bulk silicon substrate. In some embodiments, substrate 105 is a semiconductor-on-insulator substrate, such as a silicon-on-insulator substrate, a silicon germanium-on-insulator substrate, or a germanium-on-insulator substrate.

Interconnect structure 24 and interconnect structure 26 can each include circuitry fabricated on and/or over device layer 22 by middle-of-line (MOL) processing and/or back-end-of-line (BEOL) processing. Interconnect structure 24 and interconnect structure 26 each include a combination of insulator layers (generally depicted as an insulator layer 150, an insulator layer 152, and an insulator layer 154) and electrically conductive layers (e.g., patterned metal layers formed by conductive lines, conductive vias, conductive contacts, or a combination thereof, such as conductive lines 160, conductive vias 162, conductive lines 164, conductive vias 166, contacts 168, conductive vias 170, conductive connections 172, conductive connections 174, conductive connections 176, etc.) configured to form electrically conducting routing structures (i.e., electrical paths). The conductive layers can form vertical interconnects, such as device-level contacts and/or vias, that connect horizontal interconnects, such as conductive lines, in different layers/levels (or different planes) of interconnect structure 24 and/or interconnect structure 26. In some embodiments, interconnect structure 24 and/or interconnect structure 26 route electrical signals between devices and/or components of device layer 22 and/or the interconnect structures. In some embodiments, interconnect structure 24 and/or interconnect structure 26 distribute and/or route electrical signals (for example, clock signals, voltage signals, ground signals, etc.) to devices and/or device components of device layer 22 and/or the interconnect structures.

Interconnect structure 24 is disposed over surface 105A of substrate 105 (i.e., a frontside, active surface where transistors T and/or other electronic devices are formed), and interconnect structure 26 is disposed over surface 105B, such that device layer 22 is disposed between interconnect structure 24 and interconnect structure 26, a frontside $F_E$ of electronic die 20 is formed by interconnect structure 24, and a backside $B_E$ of electronic die 20 is formed by interconnect structure 26. Interconnect structure 24 is configured to route electrical signals between electronic die 20 and photonic die 30, and interconnect structure 26 is configured to route electrical signals between electronic die 20 and package substrate 40. In the depicted embodiment, interconnect structure 26 is configured to deliver power to device layer 22. For example, power supply voltages and/or reference voltages (i.e., $V_{DD}$) and/or $V_{SS}$) are applied to electronic devices of device layer 22, such as transistors T, via interconnect structure 26. Electronic die 20 is thus configured with a backside power delivery structure/network (i.e., interconnect structure 26 is a backside power delivery layer/network).

Referring to FIG. 1, photonic die 30 (also referred to as a p-die or a photonic IC (PIC)) is configured to receive optical signals, transmit optical signals, process optical signals, communicate with other features and/or dies of package 10 (e.g., by transmitting and/or receiving electrical signals to and/or from electronic die 20 and/or package component 40), or a combination thereof. Photonic die 30 includes a functional IC formed from photonic/optical components. Referring to FIG. 1 and FIG. 3A, photonic die 30-1 (and thus photonic die 30) has a frontside interconnect structure. For example, photonic die 30/photonic die 30-1 has device layer 32 between interconnect structure 34 and substrate 36, such that in package 10, a frontside $F_P$ of photonic die 30 (i.e., photonic die 30-1) is formed by interconnect structure 34 and a backside $B_P$ of photonic die 30 (i.e., photonic die 30-1) is formed by substrate 36.

Device layer 32 can include circuitry fabricated thereon and/or thereover by FEOL processing. Device layer 32 includes a photonic transmission structure formed from an optical device portion 202 configured to receive and/or transmit optical signals (i.e., light (photons)). Device layer 32 can further include an insulator layer 204 and an insulator layer 206, where insulator layer 204 is disposed between optical device portion 202 and substrate 36 and optical device portion 202 is disposed in insulator layer 206. The photonic transmission structure and/or optical device portion 202 can include photonic/optical devices and/or components, such as a waveguide, a grating coupler, an edge coupler, a filter, a modulator, a photodetector, a laser, a laser diode, an optical signal splitter, an optical fiber, other suitable optical device and/or component, or a combination thereof. In some embodiments, the photonic transmission structure and/or optical device portion 202 includes a photodetector and a waveguide, and the photodetector can detect optical signals within the waveguide and generate electrical signals corresponding to the optical signals. In some embodiments, the photonic transmission structure and/or optical device portion 202 includes a modulator and a waveguide, and the modulator can receive electrical signals and generate corresponding optical signals within the waveguide. In some embodiments, a silicon layer may be patterned and processed to form a silicon waveguide, and in some embodiments, a grating coupler, over insulator layer 206, where the silicon waveguide and the grating coupler form a portion of optical device portion 202. The grating coupler can transmit light to the silicon waveguide. In some embodiments, optical device portion 202 (e.g., the waveguide and/or the grating coupler) receive light from an optical fiber. In some embodiments, device layer 32 further includes an electronic device portion 210 that includes electronic devices, such as transistors (such as those described herein), diodes, resistors, capacitors, inductors, other electronic components, or a combination thereof.

Interconnect structure 34 includes circuitry fabricated on and/or over device layer 32 by MOL processing and/or BEOL processing. Interconnect structure 34 includes a combination of insulator layers (generally depicted as an insulator layer 250) and electrically conductive layers (e.g., patterned metal layers formed by conductive lines, conductive vias, conductive contacts, or a combination thereof, such as conductive lines 260, conductive vias 262, conductive contacts 264, etc.) configured to form electrically conducting routing structures (i.e., electrical paths). The conductive layers can form vertical interconnects, such as device-level contacts and/or vias, that connect horizontal interconnects, such as conductive lines, in different layers/levels (or different planes) of interconnect structure 34. In some embodiments, interconnect structure 34 routes electrical signals between devices and/or components of device layer 32 and/or interconnect structure 34. In some embodiments, interconnect structure 34 is and/or forms a portion of a redistribution layer/structure (RDL).

Substrate 36 has a surface 36A and a surface 36B, where a thickness of substrate 36 is along a z-direction between surface 36A and surface 36B. Surface 36A is opposite surface 36B, and in the depicted embodiment, device layer 32 (which includes photonic transmission structure) is formed over surface 36A. In some embodiments, surface 36A and surface 36B are a top surface (also referred to as a front surface or a frontside) and a bottom surface (also referred to as a back surface or a backside), respectively, of substrate 36. In some embodiments, surface 36A and surface 36B are an active surface and a non-active surface, respectively, of substrate 36 (i.e., devices are formed over and/or on the active surface). In some embodiments, substrate 36 is a bulk semiconductor substrate formed from an elementary semiconductor, such as silicon and/or germanium; a compound semiconductor, such as silicon carbide, gallium arsenide, gallium phosphide, indium phosphide, indium arsenide, indium antimonide, or a combination thereof; an alloy semiconductor, such as SiGe, GaAsP, AlInAs, AlGaAs, GaInAs, GaInP, GaInAsP, or a combination thereof; or a combination thereof. In some embodiments, substrate 36, insulator layer 204, and a semiconductor layer from which optical device portion 202 is formed by patterning form a semiconductor-on-insulator substrate. In some embodiments, substrate 36 is a glass substrate, a dielectric substrate, or a ceramic substrate.

Referring to FIG. 1, electronic die 20 and photonic die 30 are attached to package component 40, which can be a cored package substrate, a coreless package substrate, an interposer, a printed circuit board (PCB), or the like. For example, electronic die 20 and photonic die 30 are attached and/or bonded by connectors 50 (which when attached are collectively referred to as a die/chip stack), and electronic die 20 and package component 40 are attached and/or bonded by connectors 60. Connectors 50 physically and/or electrically connect electronic die 20 and photonic die 30, connectors 60 physically and/or electrically connect electronic die 20 and package component 40, and connectors 70 physically and/or electrically connect package component 40 and another component. Connectors 50 can be electrically conductive bumps/balls formed on electrically conductive regions/pads of electronic die 20 (e.g., of interconnect structure 24) and photonic die 30 (e.g., of interconnect structure 34) and facilitate electrical connection of electronic die 20 and photonic die 30. Connectors 60 can be electrically conductive bumps/balls formed on conductive regions/pads of electronic die 20 (e.g., of interconnect structure 26) and package component 40 (e.g., on conductive portions thereof) and facilitate electrical connection of electronic die 20 and package component 40. Connectors 70 can be bumps/balls formed on conductive regions/pads of package component 40 (e.g., on conductive portions thereof) and facilitate electrical connection of package component 40 to another package component, such as a PCB. Connectors 50, connectors 60, and connectors 70 can include solder, copper, aluminum, gold, nickel, silver, palladium, tin, other suitable electrically conductive material, or a combination thereof. Connectors 50, connectors 60, and connectors 70 can be and/or include lead-free solder balls, solder balls, ball grid array (BGA) balls, balls and/or bumps formed by a controlled collapse chip technique (i.e., C4 bumps), microbumps, other types of electrically conductive balls and/or bumps, or a combination thereof. In some embodiments, connectors 50 are microbumps and connectors 60 are C4 bumps.

Thermal structure 80 is disposed over backside $B_P$ of photonic die 30 (e.g., substrate 36) and is configured to equalize thermal energy and/or reduce thermal stress of package 10. In the depicted embodiment, thermal structure 80 is a heat spreader configured to equalize thermal energy and/or reduce thermal stress of photonic die 30 and/or electronic die 20, for example, by dissipating heat generated by photonic die 30 and/or electronic die 20. The heat spreader includes a thermally conductive material, such as a metallic material (e.g., titanium nitride, tantalum nitride, other suitable thermally conductive material, or a combination thereof).

Various components of package 10, such as electronic die 20, photonic die 30, connectors 50, connectors 60, and thermal structure 80, can be encapsulated by encapsulant 90. Encapsulant 90 (also referred to as a molding layer) can fill gaps between electronic die 20 and photonic die 30, electronic die 20 and package component 40, connectors 50, connectors 60, etc. In the depicted embodiment, encapsulant 90 covers sidewalls of electronic die 20, photonic die 30, connectors 50, connectors 60, and thermal structure 80, and further covers a top surface of package component 40. In some embodiments, encapsulant 90 includes a base material having, for example, a polymer matrix, and filler particles mixed in the base material. In some embodiments, the base material is a polymer material, an epoxy material, a resin material, other suitable base material, or a combination thereof. In some embodiments, filler particles include silica, aluminum oxide, diamond, boron nitride, zinc oxide, silicon, germanium, aluminum nitride, graphite, titanium, tantalum, aluminum, aluminum copper, aluminum silicon copper, copper, manganese, tungsten, zinc, nickel, other filler particle, or a combination thereof. In some embodiments, encapsulant 90 includes a dielectric material having low permittivity and/or low loss tangent properties. In some embodiments, an underfill is between electronic die 20 and photonic die 30 and/or an underfill is between electronic die 20 and package component 40. The underfill can fill gaps between connectors 50 and/or connectors 60. The underfill may be formed before encapsulant 90 and/or a material of the underfill may be different than a material of encapsulant 90. In some embodiments, the underfill is an epoxy material.

In FIG. 1, because electronic die 20 is configured with a dual-sided interconnect structure that can provide electronic die 20 with backside power delivery, photonic die 30 can be stacked on top of electronic die 20, and electronic die 20 can be oriented between photonic die 30 and package substrate 40. For example, frontside $F_P$ of photonic die 30 can be bonded to frontside $F_E$ of electronic die 20 (i.e., electronic die 20 and photonic die 30 have a face-to-face (frontside-to-frontside) bonding orientation). Because electronic die 20 has backside power delivery (e.g., interconnect structure 26), through semiconductor vias (TSVs), such as through silicon vias, typically implemented in and extending through photonic die 30 can be eliminated, which can improve package reliability and reduce costs.

Figure 3B:
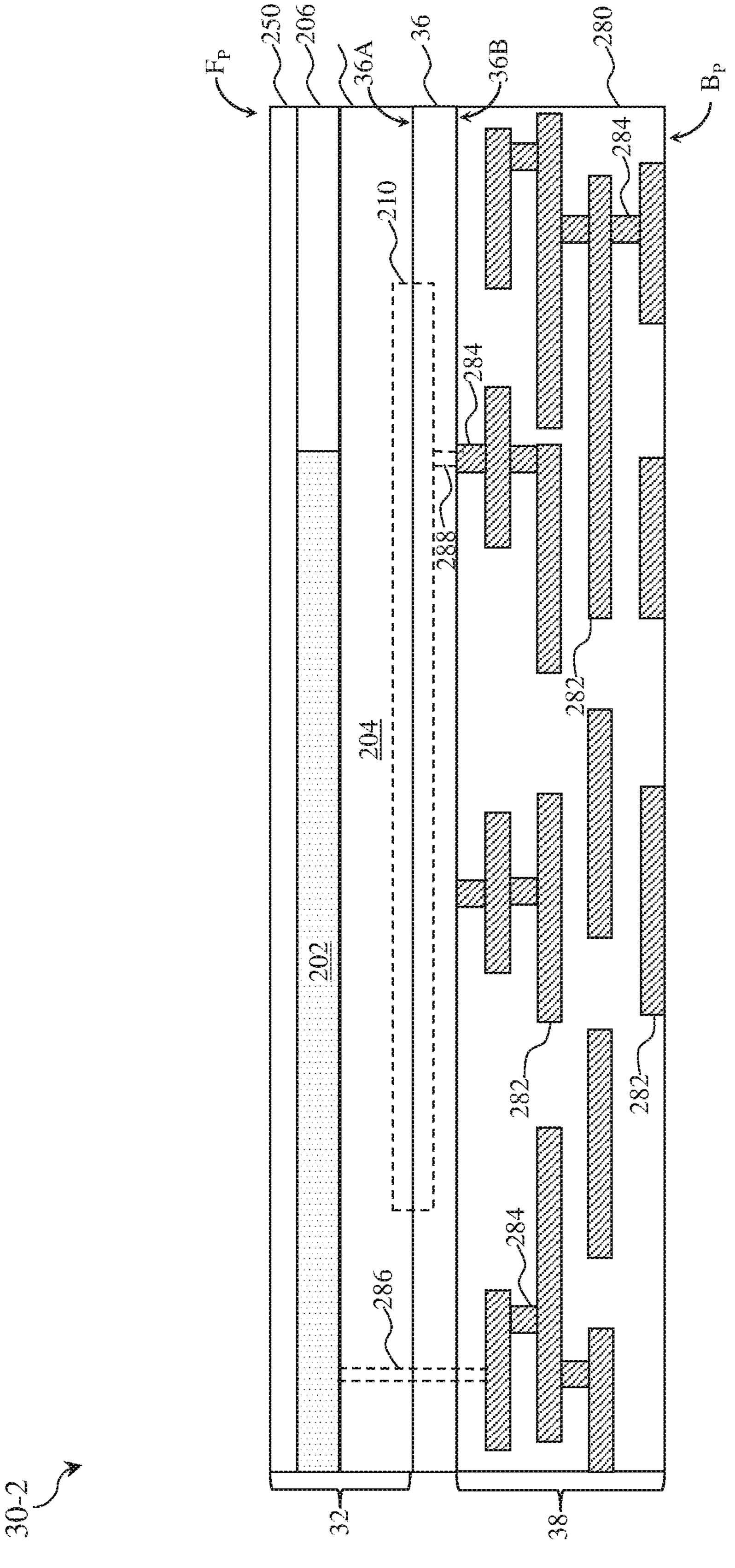
FIG. 3B is a diagrammatic cross-sectional view of a photonic die, in portion or entirety, that can be included in a package according to various aspects of the present disclosure.
Figure 4:
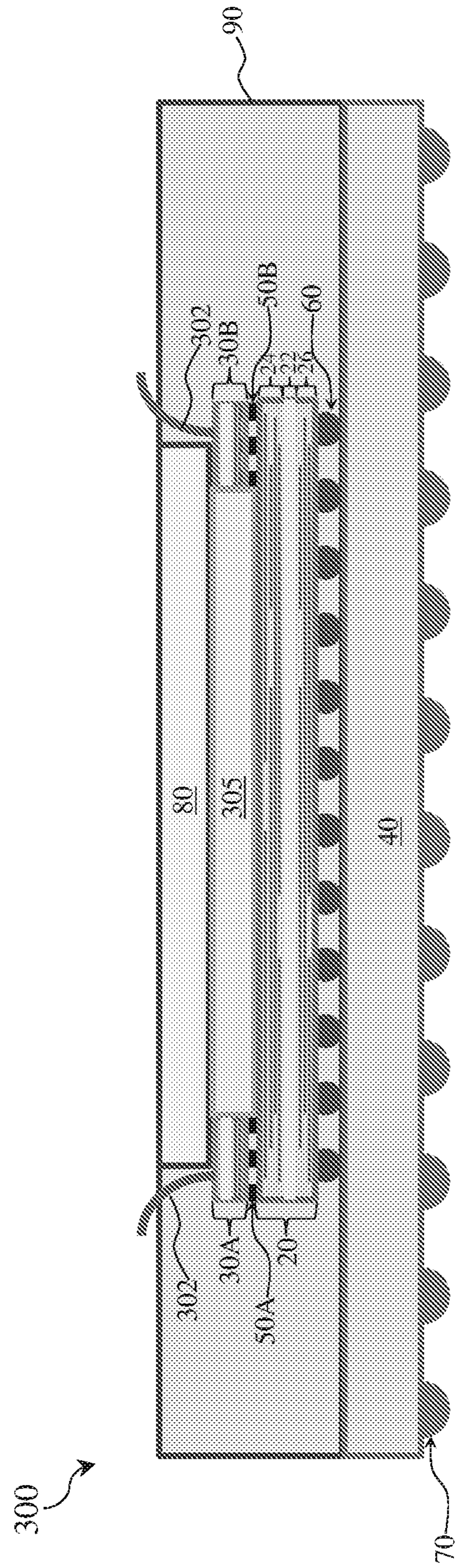
FIGS. 4, 6, 7, 9, 11, 13, and 15 are diagrammatic cross-sectional views of various packages, in portion or entirety, according to various aspects of the present disclosure.
Figure 5:
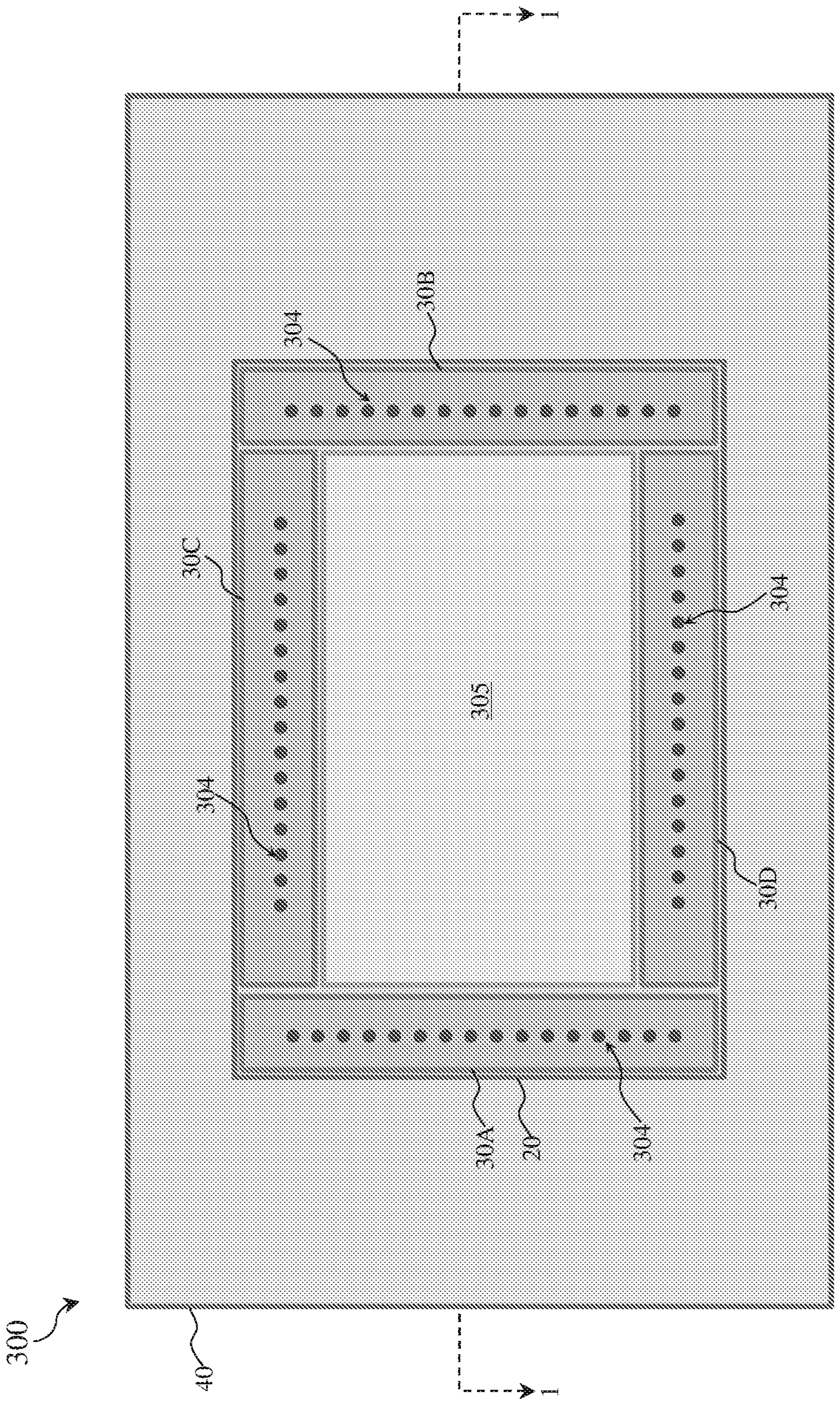
FIGS. 5, 8, 10, 12, and 14 are diagrammatic top views of various packages, in portion or entirety, according to various aspects of the present disclosure.

Referring to FIG. 2, FIG. 3B, FIG. 4, and FIG. 5, FIG. 4 is a diagrammatic cross-sectional view of a package 300, in portion or entirety, taken along line 1-1 of FIG. 5 according to various aspects of the present disclosure, FIG. 5 is a diagrammatic top view of package 300, in portion or entirety, according to various aspects of the present disclosure, and FIG. 3B is a diagrammatic cross-sectional view of a photonic die 30-2, in portion or entirety, that can be included in package 300 according to various aspects of the present disclosure. In FIG. 4 and FIG. 5, package 300 includes electronic die 20 (having device layer 22 disposed between interconnect structure 24 and interconnect structure 26), a set of photonic dies (e.g., a photonic die 30A, a photonic die 30B, a photonic die 30C, and a photonic die 30D (each of which can be configured as photonic die 30-2 of FIG. 3B (having substrate 36 disposed between device layer 32 and an interconnect structure 38))), package component 40, connectors 50A, connectors 50B, connectors 60, connectors 70, thermal structure 80, and encapsulant 90. In FIG. 5, thermal structure 80 is omitted for a view of photonic dies 30A-30D. FIG. 4, FIG. 5, FIG. 3B, and FIG. 2 are discussed concurrently herein for ease of description/understanding and have been simplified for the sake of clarity to better understand the inventive concepts of the present disclosure. Additional features can be added in package 300, electronic die 20, photonic die 30A, photonic die 30B, photonic die 30C, photonic die 30D, photonic die 30-2, or a combination thereof, and some of the features described below can be replaced, modified, or eliminated in other embodiments of package 300, electronic die 20, photonic die 30A, photonic die 30B, photonic die 30C, photonic die 30D, photonic die 30-2, or a combination thereof.

Referring to FIG. 3B and FIG. 4, photonic die 30-2 (and thus photonic dies 30A-30D) has a backside interconnect structure. For example, photonic dies 30A-30D/photonic die 30-2 has substrate 36 between device layer 32 and interconnect structure 38, such that in package 300, a frontside $F_P$ of photonic dies 30A-30D (i.e., photonic dies 30-2) is formed by device layer 32 and a backside $B_P$ of photonic dies 30A-30D (i.e., photonic dies 30-2) is formed by interconnect structure 38. In such embodiments, device layer 32 (which includes the photonic transmission structure) is formed over surface 36A of substrate 36, interconnect structure 38 is formed over backside surface 36B of substrate 36, and a thickness of substrate 36 in photonic die 30-2 is less than a thickness of substrate 36 in photonic die 30-1. Further, in such embodiments, device layer 32 can include a material layer 250 over optical device portion 202 of device layer 32. Material layer 250 can be a single layer or multiple layers. In some embodiments, material layer 250 includes a light-transparent material at least over optical device portion 202. In some embodiments, a portion of the photonic transmission structure is formed on material layer 250, formed in material layer 250, includes material layer 250, or a combination thereof.

Interconnect structure 38 can include circuitry fabricated on and/or over substrate 36 by MOL processing and/or BEOL processing. Interconnect structure 38 includes a combination of insulator layers (generally depicted as an insulator layer 280) and electrically conductive layers (e.g., patterned metal layers formed by conductive lines, conductive vias, conductive contacts, or a combination thereof, such as conductive lines 282, conductive vias 284, conductive connections 286, conductive connections 288, etc.) configured to form electrically conducting routing structures (i.e., electrical paths). The conductive layers can form vertical interconnects, such as device-level contacts and/or vias, that connect horizontal interconnects, such as conductive lines, in different layers/levels (or different planes) of interconnect structure 38. In some embodiments, interconnect structure 38 routes electrical signals between devices and/or components of device layer 32 and/or interconnect structure 38. In some embodiments, interconnect structure 38 is and/or forms a portion of a redistribution layer/structure.

Referring to FIG. 4, electronic die 20 and photonic dies 30A-30D are attached to package component 40. For example, electronic die 20 and photonic die 30A are attached and/or bonded by connectors 50A, electronic die 20 and photonic die 30B are attached and/or bonded by connectors 50B, electronic die 20 and photonic die 30C are attached and/or bonded by connectors, electronic die 20 and photonic die 30D are attached and/or bonded by connectors 50B, electronic die 20 and package component 40 are attached and/or bonded by connectors 60, and package component 40 can be attached and/or bonded to another component by connectors 70. Connectors 50A physically and/or electrically connect electronic die 20 and photonic die 30A, connectors 50B physically and/or electrically connect electronic die 20 and photonic die 30B, and other connectors physically and/or electrically connect electronic die 20 and photonic die 30C and photonic die 30D. Connectors 50A, connectors 50B, and connectors attaching electronic die 20 and other photonic dies (e.g., photonic die 30C and photonic die 30D) are similar to connectors 50. For example, connectors 50A, connectors 50B, and connectors attaching electronic die 20 and other photonic dies can be electrically conductive bumps/balls formed on electrically conductive regions of electronic die 20 and respective photonic dies 30A-30D (e.g., interconnect structures 38 of photonic dies 30A-30D) and facilitate electrical connection between electronic die 20 and photonic dies 30A-30D.

In package 300, photonic dies 30A-30D are configured to function as optical input/outputs (I/Os) and can be referred to as optical I/O chips. In such embodiments, photonic transmission structures and/or optical device portions 202 of photonic dies 30A-30D can include a waveguide, an optical fiber array formed from optical fibers 302, and a grating coupler 304. The optical fiber array can be aligned with grating coupler 304. In FIG. 5, photonic dies 30A-30D are arranged on edges (i.e., along a perimeter) of electronic die 20. For example, photonic die 30A and photonic die 30B are oriented lengthwise along a first direction (e.g., a y-direction) along opposite edge regions of electronic die 20 extending along the first direction, and photonic die 30C and photonic die 30D are oriented lengthwise along a second direction (e.g., an x-direction) along opposite edge regions of electronic die 20 extending along the second direction. In some embodiments, photonic dies 30A-30D are connected to control portions of electronic die 20. Photonic dies 30A-30D can form an optical I/O ring (here, a rectangular ring), and grating couplers 304/optical fibers 302 form a grating coupler/optical fiber array along the perimeter of electronic die 20. The present disclosure contemplates various arrangements of optical I/O chips on electronic die 20, including arrangements where optical I/O chips are attached to an interior region of electronic die 20, not just edge regions of electronic die 20.

Further, in package 300, a thermal structure 305 is disposed over frontside $F_E$ of electronic die 20 (e.g., interconnect structure 24) and between photonic dies 30A-30D. For example, thermal structure 305 fills a gap between photonic die 30A and photonic die 30B and a gap between photonic die 30C and photonic die 30D. Thermal structure 305 is configured to equalize thermal energy and/or reduce thermal stress of package 300, along with electrically isolate photonic dies 30A-30D from each other. Thermal structure 305 includes a thermally conductive and electrically isolative material, such as silicon oxide, aluminum oxide, aluminum nitride, aluminum oxynitride, boron nitride, other thermally conductive and electrically isolative material, or a combination thereof. Thermal structure 305 is a thermal equalization layer, in some embodiments. Package 300 can further include thermal structure 80 (e.g., heat spreader) disposed over thermal structure 305 and front sides $F_P$ of photonic dies 30A-30D (e.g., over device layers 32), and thermal structure 80 is configured to equalize thermal energy and/or reduce thermal stress of package 300. In the depicted embodiment, thermal structure 80 covers portions of photonic dies 30A-30D to accommodate grating couplers 304/optical fibers 302 of photonic dies 30A-30D. Other configurations are contemplated.

Various components of package 300, such as electronic die 20, photonic die 30A, photonic die 30B, connectors 50A, connectors 50B, connectors 60, thermal structure 80, and thermal structure 305, can be encapsulated by encapsulant 90. In FIG. 4 and FIG. 5, because electronic die 20 is configured with a dual-sided interconnect structure that can provide electronic die 20 with backside power delivery, photonic dies 30A-30D can be stacked on top of electronic die 20, and electronic die 20 can be oriented between photonic dies 30A-30D and package substrate 40. For example, backsides $B_P$ of photonic dies 30A-30D (e.g., interconnect structures 38 thereof) can be bonded to frontside $F_E$ of electronic die 20 (e.g., interconnect structure 24 thereof). In other words, electronic die 20 and photonic dies 30A-30D have a back-to-face (backside-to-frontside) bonding orientation. Because electronic die 20 has backside power delivery (e.g., interconnect structure 26), photonic dies 30A-30D and electronic die 20 can be electrically connected to each other and/or package component 40 without TSVs extending therethrough, which can improve package reliability and reduce costs.

Figure 6:
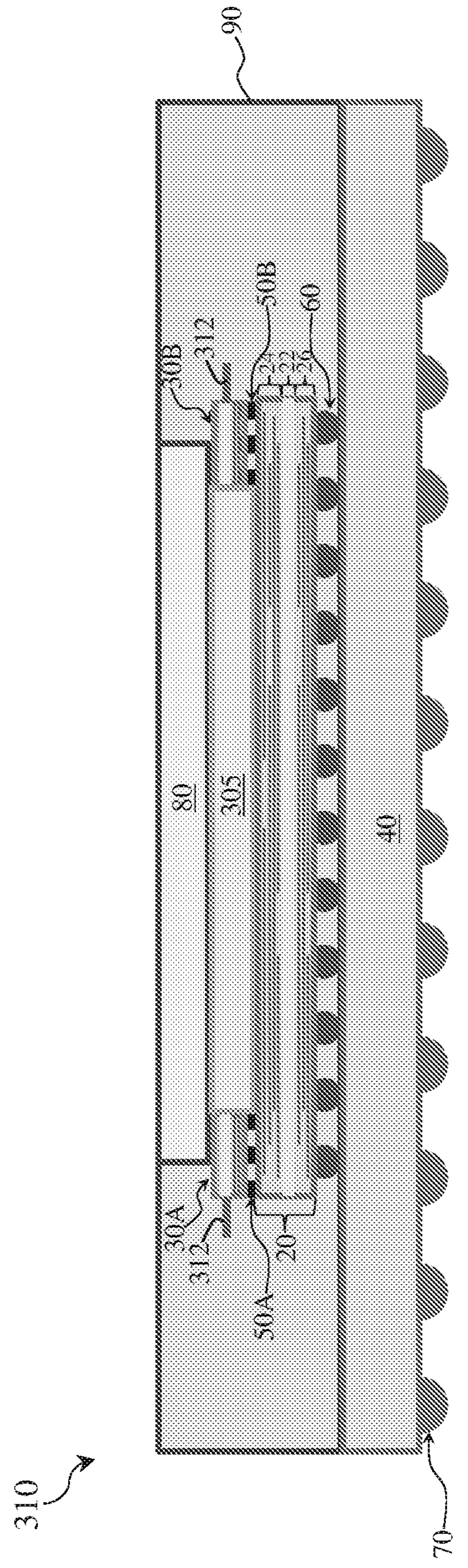

Referring to FIG. 2, FIG. 3B, and FIG. 6, FIG. 6 is a diagrammatic cross-sectional view of a package 310, in portion or entirety, according to various aspects of the present disclosure. Package 310 is similar to package 300. For example, package 310 includes electronic die 20 (having device layer 22 disposed between interconnect structure 24 and interconnect structure 26), a set of photonic dies (e.g., photonic die 30A and photonic die 30B (each of which can be configured as photonic die 30-2 of FIG. 3B (having substrate 36 disposed between device layer 32 and interconnect structure 38))), package component 40, connectors 50A, connectors 50B, connectors 60, connectors 70, thermal structure 80, encapsulant 90, and thermal structure 305. In package 310, photonic die 30A and photonic die 30B are configured to function as optical I/Os, and photonic transmission structures and/or optical device portions 202 of photonic die 30A and photonic die 30B can include a waveguide, an edge coupler, and an optical fiber array formed from optical fibers 312, where the optical fiber array can be aligned with the edge coupler. In such embodiments, the optical fiber array (and thus optical fibers 312) are attached to sides of photonic die 30A and photonic die 30B, instead of top surfaces thereof such as in package 300. In package 310, because electronic die 20 has backside power delivery (e.g., interconnect structure 26), photonic die 30A, photonic die 30B, and electronic die 20 can be electrically connected to each other and/or package component 40 without TSVs extending therethrough, which can improve package reliability and reduce costs. FIG. 6 has been simplified for the sake of clarity to better understand the inventive concepts of the present disclosure. Additional features can be added in package 310, and some of the features described below can be replaced, modified, or eliminated in other embodiments of package 310.

Figure 7:
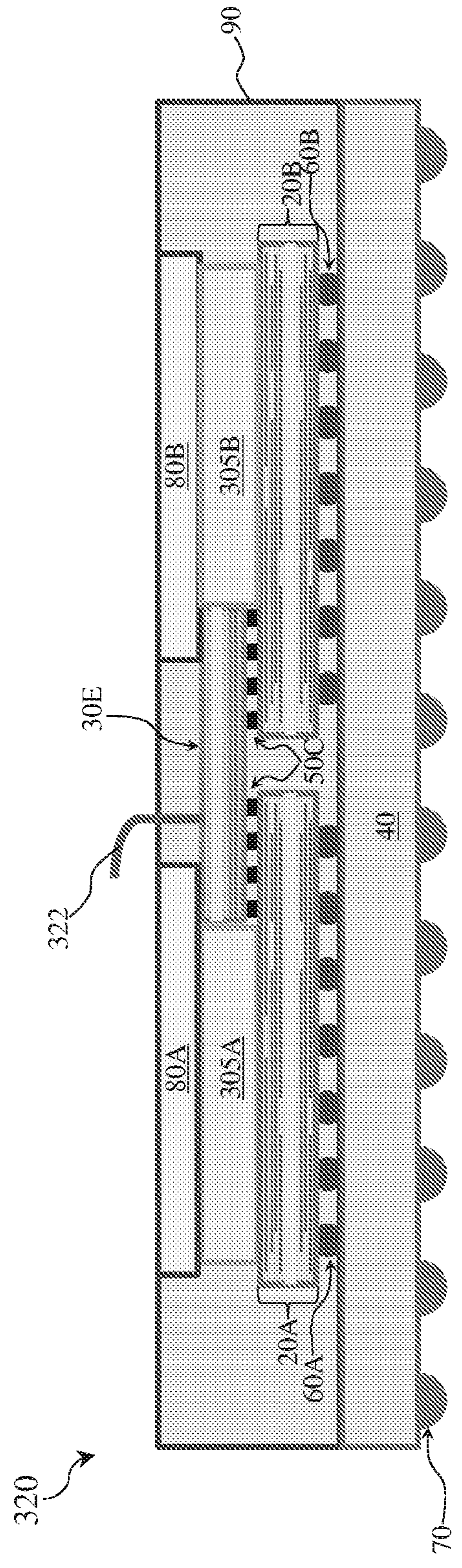
Figure 8:
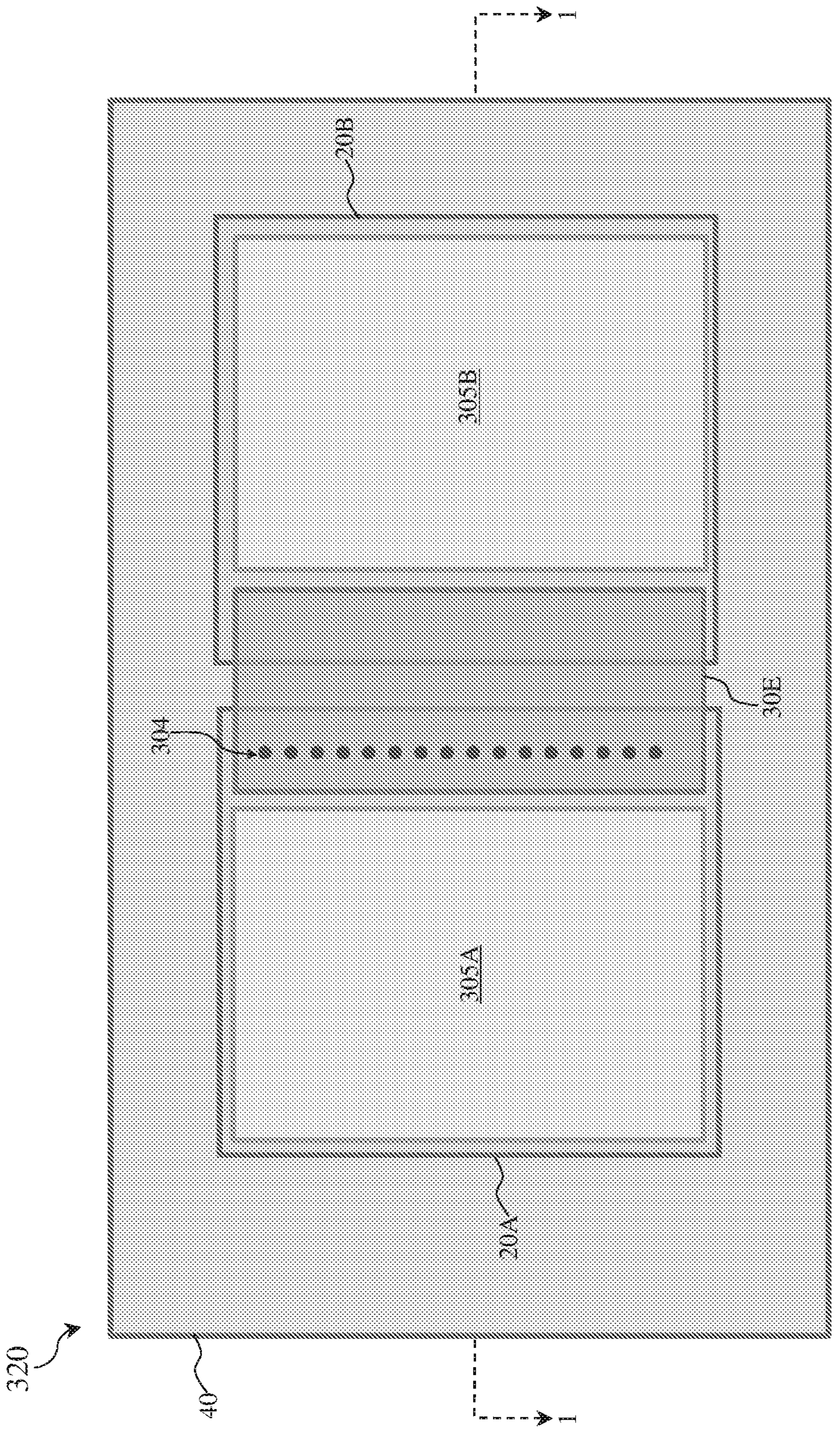

Referring to FIG. 2, FIG. 3B, FIG. 7, and FIG. 8, FIG. 7 is a diagrammatic cross-sectional view of a package 320, in portion or entirety, taken along line 1-1 of FIG. 8 according to various aspects of the present disclosure, and FIG. 8 is a diagrammatic top view of package 320, in portion or entirety, according to various aspects of the present disclosure. In FIG. 7 and FIG. 8, package 320 includes a set of electronic dies (e.g., an electronic die 20A and an electronic die 20B, each of which can be configured as electronic die 20 (having device layer 22 disposed between interconnect structure 24 and interconnect structure 26) of FIG. 2), a photonic die 30E (which can be configured as photonic die 30-2 of FIG. 3B (having substrate 36 disposed between device layer 32 and an interconnect structure 38)), package component 40, connectors 50C, connectors 60A, connectors 60B, connectors 70, a thermal structure 80A, a thermal structure 80B, encapsulant 90, a thermal structure 305A, and a thermal structure 305B. In FIG. 8, thermal structure 80A and thermal structure 80B are omitted. FIG. 7, FIG. 8, FIG. 3B, and FIG. 2 are discussed concurrently herein for ease of description/understanding and have been simplified for the sake of clarity to better understand the inventive concepts of the present disclosure. Additional features can be added in package 320, electronic die 20, electronic die 20A, electronic die 20B, photonic die 30E, photonic die 30-2, or a combination thereof, and some of the features described below can be replaced, modified, or eliminated in other embodiments of package 320, electronic die 20, electronic die 20A, electronic die 20B, photonic die 30E, photonic die 30-2, or a combination thereof.

Referring to FIG. 7 and FIG. 8, photonic die 30E is an optical bridge between electronic die 20A and electronic die 20B, photonic die 30E laterally connects electronic die 20A and electronic die 20B, and photonic die 30E spans/bridges a gap between electronic die 20A and electronic die 20B. In some embodiments, photonic die facilitates communication between electronic die 20A and electronic die 20B (e.g., by routing electrical signals). Electronic die 20A, electronic die 20B, and photonic die 30E are attached to package component 40. For example, photonic die 30E is attached and/or bonded to electronic die 20A and electronic die 20B by connectors 50C, electronic die 20A and package component 40 are attached and/or bonded by connectors 60A, electronic die 20B and package component 40 are attached and/or bonded by connectors 60B, and package component 40 can be attached and/or bonded to another component by connectors 70. Connectors 50C physically and/or electrically connect photonic die 30E and electronic die 20A and electronic die 20B, connectors 60A physically and/or electrically connect electronic die 20A and package component 40, and connectors 60B physically and/or electrically connect electronic die 20B and package component 40. Connectors 50C are similar to connectors 50. Connectors 60A and connectors 60B are similar to connectors 60. For example, connectors 60A and connectors 60B can be electrically conductive bumps/balls formed on electrically conductive regions of electronic die 20A, electronic die 20B, and package component 40 and facilitate electrical connection therebetween.

In package 320, photonic die 30E can be configured to function as an optical I/O, and the photonic transmission structure and/or optical device portion 202 of photonic die 30E can include a waveguide, grating coupler 304, and an optical fiber array formed from optical fibers 322, where the optical fiber array can be aligned with the grating coupler. In the depicted embodiment (FIG. 8), the grating coupler is disposed over electronic die 20A but not electronic die 20B. In some embodiments, the grating coupler can have a portion over electronic die 20A and a portion over electronic die 20B. In some embodiments, the grating coupler is disposed over electronic die 20B but not electronic die 20A. Other configurations are contemplated.

Further, in package 320, photonic die 30E is between thermal structure 305A and thermal structure 305B, thermal structure 80A is disposed over thermal structure 305A, and thermal structure 80B is disposed over thermal structure 305B. In such configuration, thermal structure 305A is disposed between thermal structure 80A and frontside $F_E$ of electronic die 20A (e.g., interconnect structure 24 thereof), and thermal structure 305B is disposed between thermal structure 80B and frontside $F_E$ of electronic die 20B (e.g., interconnect structure 24 thereof). Thermal structure 80A and thermal structure 80B cover respective portions of photonic die 30E, such that a gap is between thermal structure 80A and thermal structure 80B. The gap can accommodate grating couplers 304/optical fibers 322 of photonic die 30E.

Further, various components of package 320, such as electronic die 20A, electronic die 20B, photonic die 30E, connectors 50C, connectors 60A, connectors 60B, thermal structure 80A, thermal structure 80B, thermal structure 305A, and thermal structure 305B, can be encapsulated by encapsulant 90. In FIG. 7 and FIG. 8, because electronic die 20A and electronic die 20B are configured with a dual-sided interconnect structure that can provide backside power delivery, photonic die 30E can be stacked on top of electronic die 20A and electronic die 20B, and electronic die 20A and electronic die 20B can be oriented between photonic die 30E and package substrate 40. For example, backside Bp of photonic die 30E (e.g., interconnect structure 38 thereof) can be bonded to front sides $F_E$ of electronic die 20A and electronic die 20B (e.g., interconnect structures 24 thereof). In other words, electronic die 20A and photonic dies 30E have a back-to-face (backside-to-frontside) bonding orientation, and electronic die 20B and photonic die 30E has a back-to-face (backside-to-frontside) bonding orientation. Because electronic die 20A and electronic die 20B have backside power delivery (e.g., interconnect structures 26), photonic die 30E, electronic die 20A, and electronic die 20B can be electrically connected to each other and/or package component 40 without TSVs extending therethrough, which can improve package reliability and reduce costs.

Figure 9:
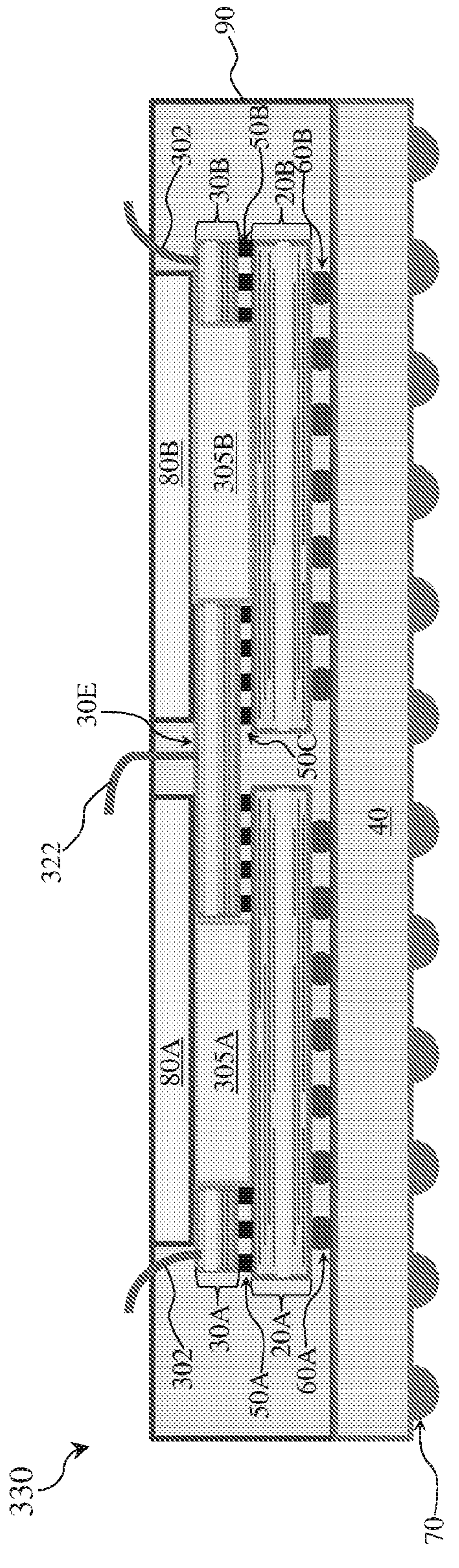
Figure 10:
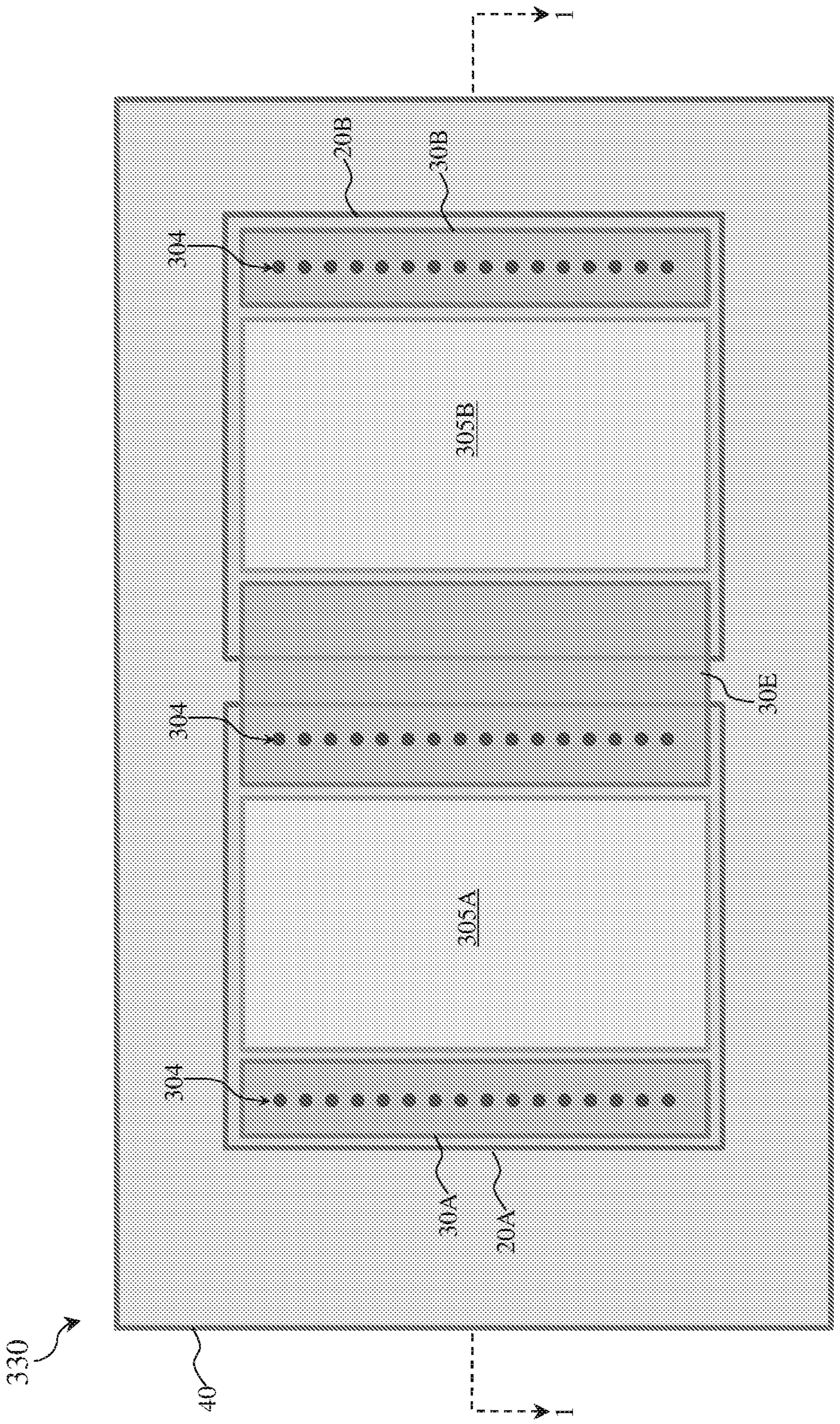

Referring to FIG. 2, FIG. 3B, FIG. 9, and FIG. 10, FIG. 9 is a diagrammatic cross-sectional view of a package 330, in portion or entirety, taken along line 1-1 of FIG. 10 according to various aspects of the present disclosure, and FIG. 10 is a diagrammatic top view of package 330, in portion or entirety, according to various aspects of the present disclosure. In FIG. 9 and FIG. 10, package 330 includes a set of electronic dies (e.g., electronic die 20A and electronic die 20B, each of which can be configured as electronic die 20 (having device layer 22 disposed between interconnect structure 24 and interconnect structure 26) of FIG. 2), an optical I/O (e.g., a set of photonic dies, such as photonic die 30A and photonic die 30B (each of which can be configured as photonic die 30-2 of FIG. 3B (having substrate 36 disposed between device layer 32 and interconnect structure 38))), an optical bridge (e.g., photonic die 30E, which can be configured as photonic die 30-2 of FIG. 3B (having substrate 36 disposed between device layer 32 and interconnect structure 38)), package component 40, connectors 50A-50C, connectors 60A, connectors 60B, connectors 70, thermal structure 80A, thermal structure 80B, encapsulant 90, thermal structure 305A, and thermal structure 305B. FIG. 9 and FIG. 10 have been simplified for the sake of clarity to better understand the inventive concepts of the present disclosure. Additional features can be added in package 330, and some of the features described below can be replaced, modified, or eliminated in other embodiments of package 330.

In package 330, photonic die 30E is arranged on edges of electronic die 20A and electronic die 20B facing one another, photonic die 30A is arranged on an edge of electronic die 20A that is opposite its edge facing electronic die 20B, and photonic die 30B is arranged on an edge of electronic die 20B that is opposite its edge facing electronic die 20A. Further, photonic die 30A, photonic die 30B, and photonic die 30E are oriented lengthwise along the same direction (e.g., a y-direction). Photonic transmission structures and/or optical device portions 202 of photonic die 30A, photonic die 30B, and photonic die 30E can include a waveguide, a grating coupler (e.g., grating couplers 304), and an optical fiber array formed from optical fibers (e.g., optical fibers 302 or optical fibers 322). In such embodiments, the optical fiber array (and thus optical fibers 302 and optical fibers 322) are attached to tops of photonic dies. Thermal structure 305A fills a gap between photonic die 30A and photonic die 30E, thermal structure 305B fills a gap between photonic die 30B and photonic die 30E, thermal structure 80A overlaps photonic die 30A and photonic die 30E in a manner that accommodates grating couplers 304/optical fiber arrays, and thermal structure 80B overlaps photonic die 30B and photonic die 30E in a manner that accommodates grating couplers 304/optical fibers. Because electronic die 20A and electronic die 20B has backside power delivery (e.g., interconnect structures 26), photonic die 30A, photonic die 30B, photonic die 30E, electronic die 20A, and electronic die 20B can be electrically connected to each other and/or package component 40 without TSVs extending therethrough, which can improve package reliability and reduce costs.

Figure 11:
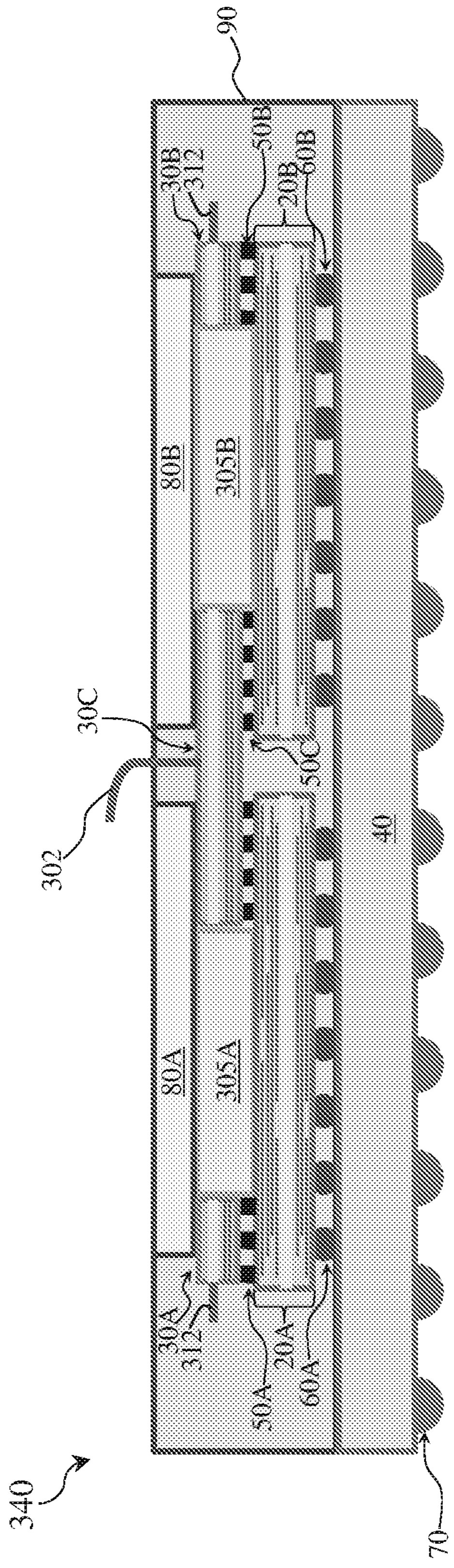

Referring to FIG. 2, FIG. 3B, and FIG. 11, FIG. 11 is a diagrammatic cross-sectional view of a package 340, in portion or entirety, according to various aspects of the present disclosure. Package 340 is similar to package 330. For example, package 340 includes a set of electronic dies (e.g., electronic die 20A and electronic die 20B, each of which can be configured as electronic die 20 (having device layer 22 disposed between interconnect structure 24 and interconnect structure 26) of FIG. 2), an optical I/O (e.g., a set of photonic dies, such as photonic die 30A and photonic die 30B (each of which can be configured as photonic die 30-2 of FIG. 3B (having substrate 36 disposed between device layer 32 and interconnect structure 38))), an optical bridge (e.g., photonic die 30E, which can be configured as photonic die 30-2 of FIG. 3B (having substrate 36 disposed between device layer 32 and interconnect structure 38)), package component 40, connectors 50A-50C, connectors 60A, connectors 60B, connectors 70, thermal structure 80A, thermal structure 80B, encapsulant 90, thermal structure 305A, and thermal structure 305B. In package 340, photonic die 30A and photonic die 30B are configured to function as optical I/Os, and photonic transmission structures and/or optical device portions 202 of photonic die 30A and photonic die 30B can include a waveguide, an edge coupler, and an optical fiber array formed from optical fibers 312, where the optical fiber array can be aligned with the edge coupler. In such embodiments, the optical fiber array (and thus optical fibers 312) is attached to sides of photonic die 30A and photonic 30B. In package 340, because electronic die 20A and electronic die 20B have backside power delivery (e.g., interconnect structures 26), photonic die 30A, photonic die 30B, photonic die 30E, electronic die 20A, and electronic die 20B can be electrically connected to each other and/or package component 40 without TSVs extending therethrough, which can improve package reliability and reduce costs. FIG. 11 has been simplified for the sake of clarity to better understand the inventive concepts of the present disclosure. Additional features can be added in package 340, and some of the features described below can be replaced, modified, or eliminated in other embodiments of package 340.

Figure 12:
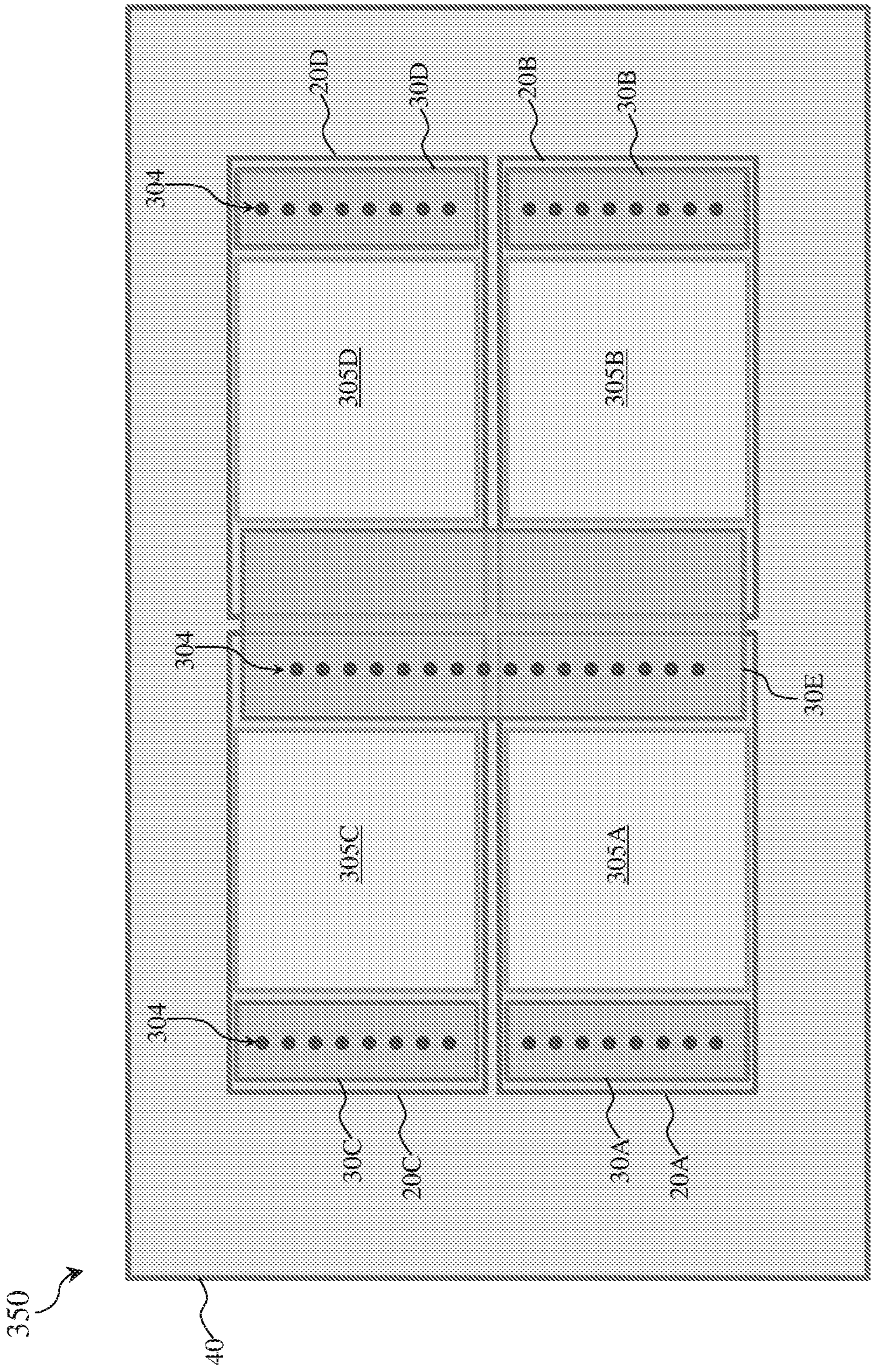

Referring to FIG. 2, FIG. 3B, and FIG. 12, FIG. 12 is a diagrammatic top view of a package 350, in portion or entirety, according to various aspects of the present disclosure. Package 350 includes a set of electronic dies (e.g., electronic die 20A, electronic die 20B, electronic die 20C, and an electronic die 20D, each of which can be configured as electronic die 20 (having device layer 22 disposed between interconnect structure 24 and interconnect structure 26) of FIG. 2), an optical I/O (e.g., a set of photonic dies, such as photonic dies 30A-30D (each of which can be configured as photonic die 30-2 of FIG. 3B (having substrate 36 disposed between device layer 32 and interconnect structure 38))), an optical bridge (e.g., photonic die 30E, which can be configured as photonic die 30-2 of FIG. 3B (having substrate 36 disposed between device layer 32 and interconnect structure 38)), package component 40, connectors (such as connectors 50, connectors 60, and connectors 70 described herein), a thermal structure (such as thermal structure 80 described herein and omitted from the top view), an encapsulant (such as encapsulant 90 described herein), thermal structure 305A, thermal structure 305B, a thermal structure 305C, and a thermal structure 305D. FIG. 12 has been simplified for the sake of clarity to better understand the inventive concepts of the present disclosure. Additional features can be added in package 350, and some of the features described below can be replaced, modified, or eliminated in other embodiments of package 350.

In package 350, electronic dies 20A-20D are configured in a two-by-two array. For example, a first row of electronic dies is formed by electronic die 20A and electronic die 20B, a second row of electronic dies is formed by electronic die 20C and electronic die 20D, a first column of electronic dies is formed by electronic die 20C and electronic die 20A, and a second column of electronic dies is formed by electronic die 20D and electronic die 20B. Photonic die 30E is connected, bonded, and attached to electronic dies 20A-20D, such that photonic die 30E can electrically communicate with and/or facilitate electrical communication of electronic dies 20A-20D. In FIG. 12, photonic die 30E is arranged on edges of electronic die 20A and electronic die 20B facing one another and on edges of electronic die 20C and electronic die 20D facing one another. Photonic dies 30A-30D are connected, bonded, and attached to electronic dies 20A-20D, respectively. For example, photonic die 30A is arranged on an edge of electronic die 20A that is opposite its edge facing electronic die 20B, photonic die 30B is arranged on an edge of electronic die 20B that is opposite its edge facing electronic die 20A, photonic die 30C is arranged on an edge of electronic die 20C that is opposite its edge facing electronic die 20D, and photonic die 30D is arranged on an edge of electronic die 20D that is opposite its edge facing electronic die 20C. Further, photonic dies 30A-30D are oriented lengthwise along the same direction (e.g., a y-direction), and photonic dies 30A-30D span a length that is substantially the same and/or slightly less than a dimension of electronic dies 20A-20D, respectively, for example, along the y-direction. Photonic die 30E is oriented lengthwise along the same direction (e.g., a y-direction) as photonic dies 30A-30D, and photonic die 30E spans a length that is substantially the same and/or slightly less than a dimension of the electronic die array along, for example, the y-direction. Photonic transmission structures and/or optical device portions 202 of photonic dies 30A-30E can include a waveguide, a grating coupler (e.g., grating couplers 304), and an optical fiber array formed from optical fibers. Thermal structure 305A fills a gap between photonic die 30A and photonic die 30E, thermal structure 305B fills a gap between photonic die 30B and photonic die 30E, thermal structure 305C fills a gap between photonic die 30C and photonic die 30E, and thermal structure 305D fills a gap between photonic die 30D and photonic die 30E. Thermal structures disposed over thermal structures 305A-305D (e.g., heat spreaders) can overlap photonic dies 30A-30E in a manner that accommodates grating couplers 304/optical fiber arrays. In package 350, because electronic dies 20A-20D have backside power delivery (e.g., interconnect structures 26), photonic die 30A, photonic die 30B, photonic die 30C, photonic die 30D, photonic die 30E, electronic die 20A, electronic die 20B, electronic die 20C, and electronic die 20D can be electrically connected to each other and/or package component 40 without TSVs extending therethrough, which can improve package reliability and reduce costs.

Figure 13:
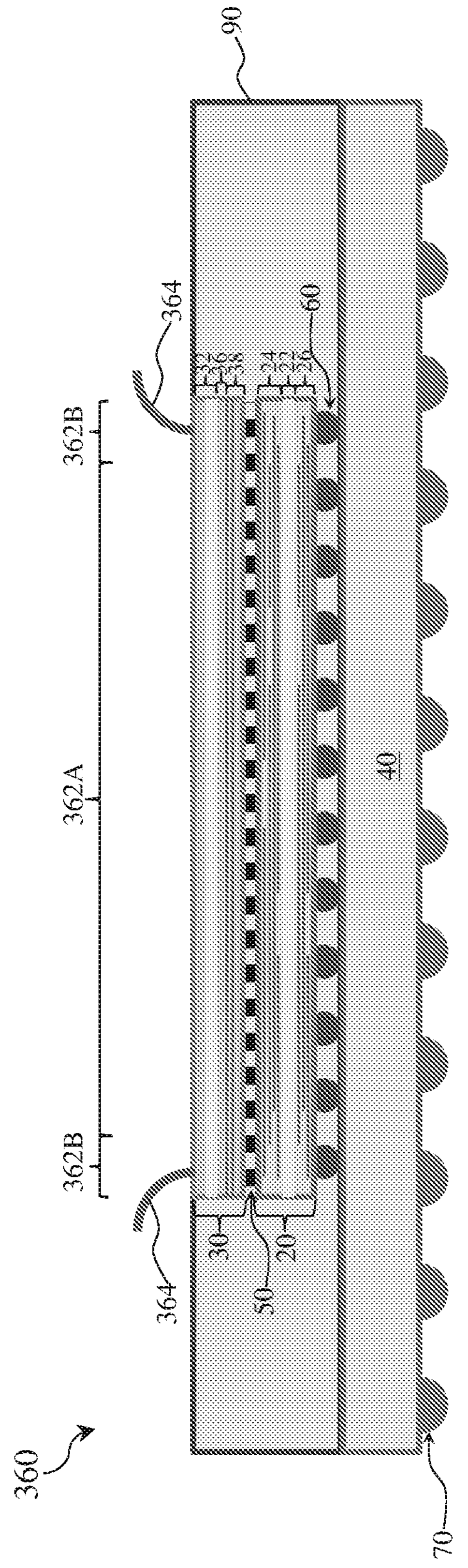
Figure 14:
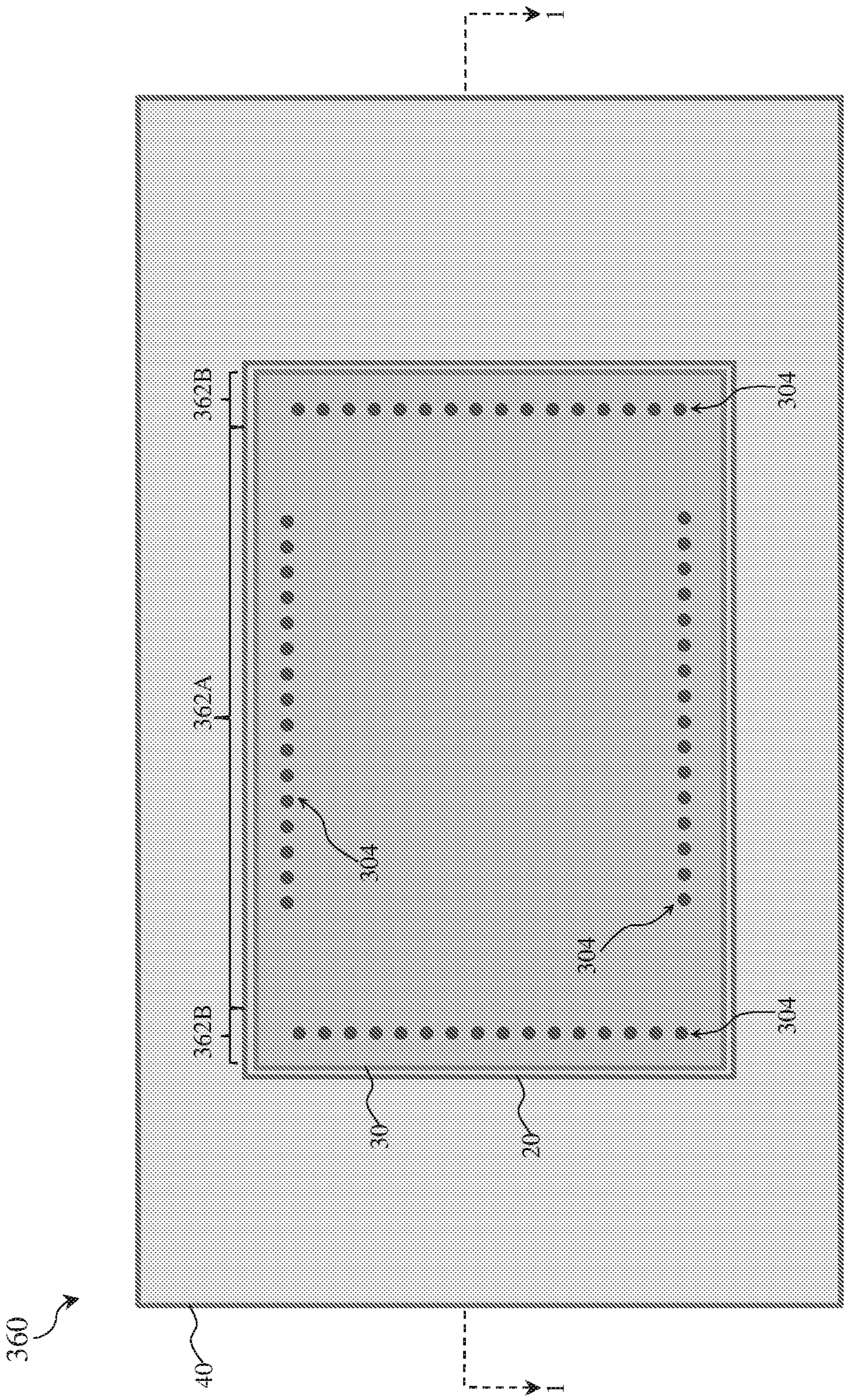

Referring to FIG. 2, FIG. 3B, FIG. 13, and FIG. 14, FIG. 13 is a diagrammatic cross-sectional view of a package 360, in portion or entirety, taken along line 1-1 of FIG. 14 according to various aspects of the present disclosure, and FIG. 14 is a diagrammatic top view of package 360, in portion or entirety, according to various aspects of the present disclosure. In FIG. 13 and FIG. 14, package 360 includes electronic die 20 (having device layer 22 disposed between interconnect structure 24 and interconnect structure 26), photonic die 30 (which can be configured as photonic die 30-2 of FIG. 3B (having substrate 36 disposed between device layer 32 and interconnect structure 38)), package component 40, connectors 50, connectors 60, connectors 70, and encapsulant 90. In package 360, photonic die 30 has an optical compute region 362A configured to perform optical processing/computing functions and optical I/O regions 362B configured to perform optical I/O functions. Optical compute region 362A is disposed between optical I/O regions 362B. In some embodiments, a size of photonic die 30 is substantially the same and/or slightly less than a size of electronic die 20, such that photonic die 30 substantially overlaps electronic die 20. In some embodiments, a size of photonic die 30 is less than or greater than electronic die 20. In some embodiments, photonic transmission structures and/or optical device portions 202 of photonic die 30 can include a waveguide, grating couplers 304, and an optical fiber array formed from optical fibers 364, where the optical fiber array can be aligned with grating couplers 304. In such embodiments, the optical fiber array (and thus optical fibers 364) can be attached to a top of photonic die 30. Various arrangements of grating couplers 304 are contemplated. For example, grating couplers 304 in optical compute regions 362B can be oriented lengthwise along a first direction (e.g., a y-direction), and grating couplers 304 in optical compute region 362B can be oriented lengthwise along a second direction (e.g., an x-direction). Grating couplers 304 can form a grating coupler ring along a perimeter of photonic die 30. In package 360, because electronic die 20 has backside power delivery (e.g., interconnect structure 26), photonic die 30 and electronic die 20 can be electrically connected to each other and/or package component 40 without TSVs extending therethrough, which can improve package reliability and reduce costs. FIG. 13 and FIG. 14 have been simplified for the sake of clarity to better understand the inventive concepts of the present disclosure. Additional features can be added in package 360, and some of the features described below can be replaced, modified, or eliminated in other embodiments of package 360.

Figure 15:
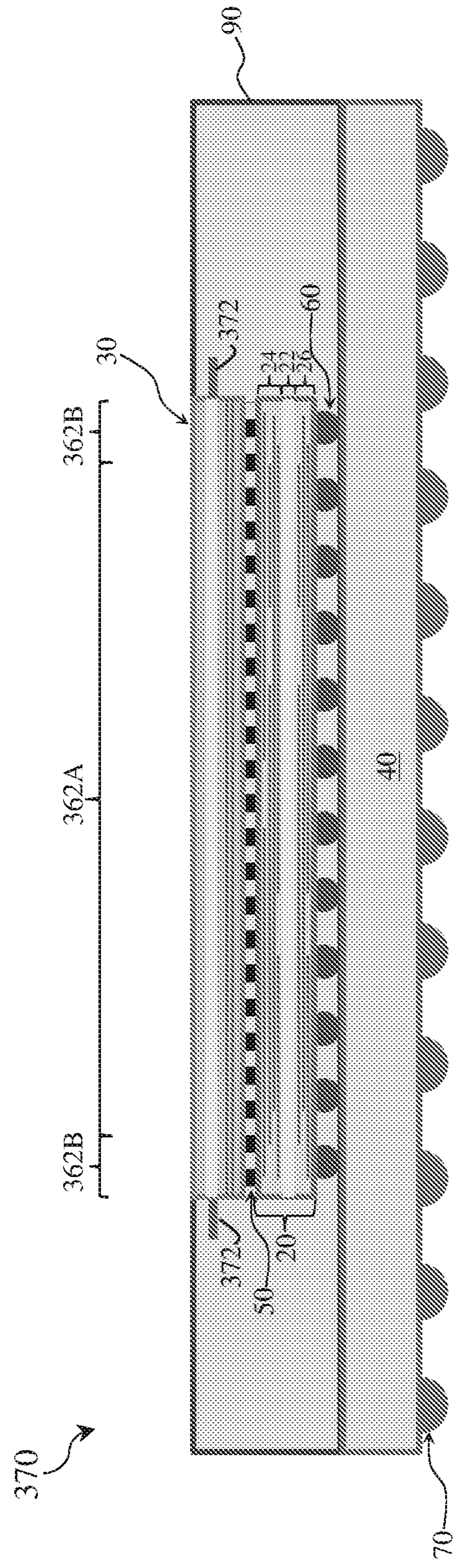

Referring to FIG. 2, FIG. 3B, and FIG. 15, FIG. 15 is a diagrammatic cross-sectional view of a package 370, in portion or entirety, according to various aspects of the present disclosure. Package 370 is similar to package 360. For example, package 370 includes electronic die 20 (having device layer 22 disposed between interconnect structure 24 and interconnect structure 26), photonic die 30 (which can be configured as photonic die 30-2 of FIG. 3B (having substrate 36 disposed between device layer 32 and interconnect structure 38)), package component 40, connectors 50, connectors 60, connectors 70, and encapsulant 90. Further, in package 360, photonic die 30 has optical compute region 362A disposed between optical I/O regions 362B. In package 360, photonic transmission structures and/or optical device portions 202 of photonic die 30 can include a waveguide, an edge coupler, and an optical fiber array formed from optical fibers 372, where the optical fiber array can be aligned with the edge coupler. In such embodiments, the optical fiber array (and thus optical fibers 372) is attached to sides of photonic die 30. As discussed herein, because electronic die 20 has backside power delivery (e.g., interconnect structure 26 thereof), photonic die 30 and electronic die 20 can be electrically connected to each other and/or package component 40 without TSVs extending therethrough, which can improve package reliability and reduce costs. FIG. 15 has been simplified for the sake of clarity to better understand the inventive concepts of the present disclosure. Additional features can be added in package 370, and some of the features described below can be replaced, modified, or eliminated in other embodiments of package 370.

Figure 16:
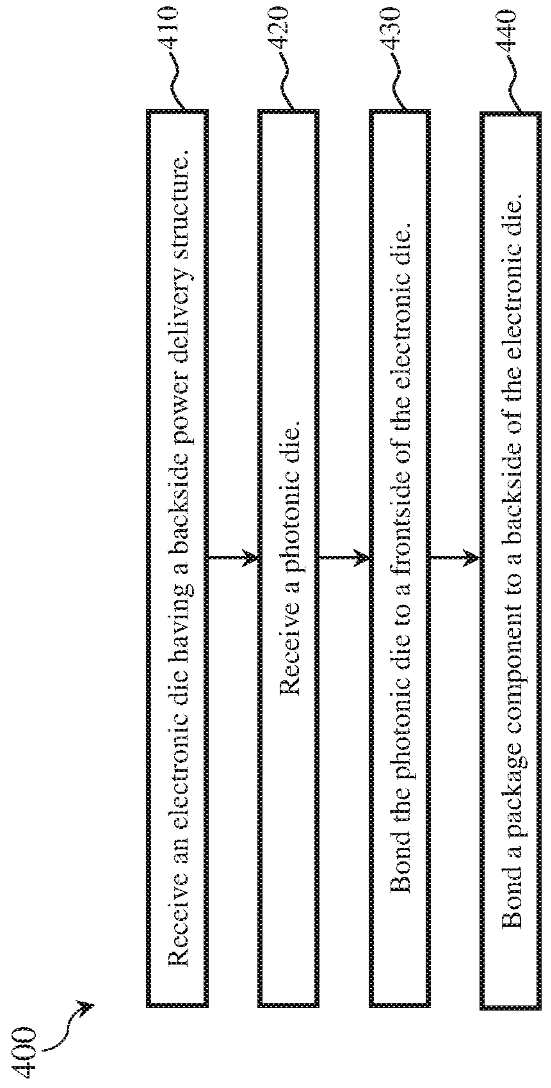
FIG. 16 is a flow chart of a method for assembling a package, such as those described herein, according to various aspects of the present disclosure.

FIG. 16 is a flow chart of a method 400, in portion or entirety, for forming a package structure, such as those described herein, according to various aspects of the present disclosure. Method 400 can include receiving an electronic die having a backside power delivery structure (e.g., electronic die 20) at block 410, receiving a photonic die (e.g., photonic die 30/photonic die 30-1/photonic die 30-2) at block 420, bonding the photonic die to a frontside of the electronic die at block 430, and bonding a package component (e.g., package component 40, such as a package substrate) to a backside of the electronic die at block 440. FIG. 16 has been simplified for the sake of clarity to better understand the inventive concepts of the present disclosure. Additional steps can be provided before, during, and after method 400, and some of the steps described can be moved, replaced, or eliminated for additional embodiments of method 400.

Conductive features of interconnect structures of packages disclosed herein (e.g., conductive lines 160, conductive vias 162, conductive lines 164, conductive vias 166, contacts 168, conductive vias 170, conductive connections 172, conductive connections 174, conductive connections 176, conductive lines 260, conductive vias 262, conductive contacts 264, conductive lines 282, conductive vias 284, conductive connections 286, conductive connections 288, etc.) include electrically conductive material, such as tungsten, ruthenium, molybdenum, cobalt, copper, aluminum, titanium, tantalum, iridium, palladium, platinum, nickel, tin, gold, silver, graphite, other suitable electrically conductive materials, alloys thereof, silicides thereof, or a combination thereof. In some embodiments, the conductive lines, the conductive vias, and the conductive connections include the same electrically conductive materials and/or the same structures (e.g., same number of layers and/or same configurations of layers). In some embodiments, the conductive lines, the conductive vias, and the conductive connections include different electrically conductive materials and/or different structures (e.g., different numbers of layers and/or different configurations of the same number of layers). In some embodiments, the conductive lines and/or the conductive vias have multilayer structures, such as a bulk layer and a liner between at least a portion of the bulk layer and an insulator layer. In some embodiments, the conductive connections are formed by a combination of conductive features. The present disclosure contemplates various configurations of materials, numbers of layers, structures, etc. of the conductive lines, the conductive vias, the contacts, and the conductive connections.

Insulator layers of interconnect structures of packages disclosed herein (e.g., insulator layer 150, insulator layer 152, insulator layer 154, insulator layer 250, insulator layer 280, etc.) include electrically insulative material, such as a dielectric material that includes silicon, oxygen, carbon, nitrogen, other suitable constituent, or a combination thereof, such as silicon oxide, silicon nitride, silicon oxynitride, silicon carbide, silicon oxycarbonitride, etc. In some embodiments, the electrically insulative material is carbon doped silicon oxide, silicon nitride, silicon oxynitride, tetraethyl orthosilicate (TEOS)-formed oxide, boron silicate glass (BSG), phosphosilicate glass (PSG), borophosphosilicate glass (BPSG), fluorosilicate glass (FSG), Black Diamond® (Applied Materials of Santa Clara, California), xerogel, aerogel, amorphous fluorinated carbon, parylene, benzocyclobutene-based (BCB) dielectric material, SiLK (Dow Chemical, Midland, Michigan), polyimide, other suitable dielectric material, or combinations thereof. In some embodiments, the electrically insulative material includes a dielectric material having a dielectric constant that is less than a dielectric constant of silicon dioxide (e.g., k<3.9). In some embodiments, the electrically insulative material includes a dielectric material having a dielectric constant that is less than about 2.5 (i.e., an extreme low-k (ELK) dielectric material), such as porous silicon oxide, silicon carbide (SiC), carbon-doped oxide (e.g., an SiCOH-based material (having, for example, Si—$CH_3$ bonds)), or combinations thereof, each of which is tuned/configured to have a dielectric constant less than about 2.5. Further, the present disclosure contemplates various configurations of materials, numbers of layers, structures, etc. of the insulator layers of interconnect structures of packages disclosed herein.

In FIGS. 4-15, the present disclosure contemplates various configurations. For example, one or more of photonic dies 30A-30D can be configured as photonic die 30-1 of FIG. 3A (having device layer 32 and an interconnect structure 34 disposed over surface 36A of substrate 36), instead of as photonic die 30-2 of FIG. 3B. In such embodiments, frontside $F_P$ of at least one of photonic dies 30A-30D (e.g., interconnect structures 34 thereof) can be bonded to frontside $F_E$ of electronic die 20 (e.g., interconnect structure 24 thereof). In other words, electronic die 20 and at least one of photonic dies 30A-30D have a face-to-face (frontside-to-frontside) bonding orientation. Whether electronic die 20 and photonic dies 30A-30D have a face-to-face or face-to-back bonding orientation, because electronic die 20 has backside power delivery (e.g., interconnect structure 26), photonic dies 30A-30D and electronic die 20 can be electrically connected to each other and/or package component 40 without TSVs extending therethrough as described herein. In some embodiments, electronic die 20 and each of photonic dies 30A-30D have a face-to-face (frontside-to-frontside) bonding orientation.

Packages that integrate photonic (optical) dies and electronic dies are disclosed herein having improved reliability and/or reduced cost. The present disclosure provides for many different embodiments. An exemplary package structure includes a package substrate, an electronic die disposed over the package substrate, and a photonic die disposed over the electronic die. The electronic die has a backside power delivery structure. The backside power delivery structure of the electronic die is attached to the package substrate, and the photonic die is attached to a frontside of the electronic die, such that the electronic die is disposed between the photonic die and the package substrate. In some embodiments, a frontside of the photonic die is attached to the frontside of the electronic die. In some embodiments, a backside of the photonic die is attached to the frontside of the electronic die. In some embodiments, the photonic die includes an optical compute region disposed between optical input/output regions.

In some embodiments, the electronic die is a first electronic die, and the backside power delivery structure is a first backside power delivery structure. In such embodiments, the package structure can further include a second electronic die having a second backside power delivery structure. The second electronic die is disposed over the package substrate and the second backside power delivery structure of the second electronic die is attached to the package substrate. The photonic die is further disposed over the second electronic die, and the photonic die is attached to a frontside of the second electronic die, such that the second electronic die is disposed between the photonic die and the package substrate. In some embodiments, the package structure further includes a first thermal structure and a second thermal structure. The photonic die is disposed between the first thermal structure and the second thermal structure.

In some embodiments, the photonic die is a first photonic die and the package structure further includes a second photonic die disposed over the electronic die. The second photonic die is attached to the frontside of the electronic die, such that the electronic die is further disposed between the second photonic die and the package substrate. The package structure can further include a thermal structure disposed between the first photonic die and the second photonic die. In some embodiments, the thermal structure is a first thermal structure and the package structure further includes a second thermal structure disposed over the first thermal structure. The second thermal structure includes a thermally conductive material and the second thermal structure includes a thermally conductive and electrically isolative material. The second thermal structure overlaps the first photonic die and the second photonic die.

Another exemplary package structure includes a photonic die, an electronic die, and a package component. The electronic die has an electronic device layer disposed between a frontside interconnect structure and a backside interconnect structure. The backside interconnect structure is configured to deliver power to the electronic device layer. The photonic die, the electronic die, and the package component are stacked top-to-bottom, the backside interconnect structure of the electronic die is connected to the package component, and the photonic die is connected to the electronic die. In some embodiments, the photonic die and the electronic die are each free of through semiconductor vias. In some embodiments, the photonic die has a photonic device layer and a frontside interconnect structure, and the frontside interconnect structure of the photonic die is connected to the frontside interconnect structure of the electronic die. In some embodiments, the photonic die has a photonic device layer and a backside interconnect structure, and the backside interconnect structure of the photonic die is connected to the frontside interconnect structure of the electronic die.

In some embodiments, the photonic die is a first photonic die, and the package structure further includes a second photonic die stacked on top of and connected to the electronic die. In such embodiments, the first photonic die is disposed over a first edge of the electronic die, and the second photonic die is disposed over a second edge of the electronic die that is opposite the first edge. The first photonic die and the second photonic die can be configured as optical input/outputs. In some embodiments, a thermally conductive and electrically isolative material is disposed between the first photonic die and the second photonic die. In some embodiments, a thermally conductive material is disposed over the first photonic die, the second photonic die, and the thermally conductive and electrically isolative material.

In some embodiments, the electronic die is a first electronic die, the photonic die is configured as an optical bridge, and the photonic die is further stacked on top of and connected to a second electronic die. In some embodiments, the package structure further includes a thermally conductive and electrically isolative material disposed over the first electronic die and the second electronic die. The thermally conductive and electrically isolative material can further be disposed along sides of the photonic die. In some embodiments, a thermally conductive material is disposed over the thermally conductive and electrically isolative material and the photonic die. In some embodiments, the photonic die is a first photonic die and the package structure further includes a second photonic die and a third photonic die. The second photonic die is stacked on top of and connected to the first electronic die. The third photonic die is stacked on top of and connected to the second electronic die. The second photonic die and the third photonic die can be configured as optical input/outputs. In some embodiments, the first photonic die is disposed between the second photonic die and the third photonic die.

An exemplary method for assembling a package can include receiving a photonic die, receiving an electronic die having a backside power delivery structure, attaching the photonic die to a frontside of the electronic die, and attaching the backside power delivery structure of the electronic die to a package component. The photonic die, the electronic die, and the package component are stacked top-to-bottom, and the electronic die is between the photonic die and the package component. In some embodiments, attaching the photonic die to the frontside of the electronic die includes bonding an interconnect structure of the photonic die with a frontside interconnect structure of the electronic die using a first connection technique. In some embodiments, attaching the backside power delivery structure of the electronic die to the package component includes bonding the backside power delivery structure of the electronic die with the package component using a second connection technique. In some embodiments, the interconnect structure of the photonic die is a backside interconnect structure, such that the photonic die and the electronic die have a back-to-front bonding orientation.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package structure comprising:

a package substrate;

an electronic die having a backside power delivery structure, wherein the electronic die is disposed over the package substrate and the backside power delivery structure of the electronic die is attached to the package substrate;

a first photonic die and a second photonic die disposed over the electronic die, wherein the first photonic die and the second photonic die are attached to a frontside of the electronic die, such that the electronic die is disposed between the first photonic die and the package substrate and between the second photonic die and the package substrate; and a first thermal structure and a second thermal structure, wherein the first thermal structure is disposed between the first photonic die and the second photonic die, the first thermal structure includes a thermally conductive and electrically isolative material, the second thermal structure is disposed over the first thermal structure, the second thermal structure includes a thermally conductive material, and the second thermal structure overlaps the first photonic die and the second photonic die.

2. The package structure of claim 1, wherein a frontside of the first photonic die is attached to the frontside of the electronic die.

3. The package structure of claim 1, wherein a backside of the first photonic die is attached to the frontside of the electronic die.

4. The package structure of claim 1, wherein the electronic die is a first electronic die, the backside power delivery structure is a first backside power delivery structure, and the package structure further includes:

a second electronic die having a second backside power delivery structure, wherein the second electronic die is disposed over the package substrate and the second backside power delivery structure of the second electronic die is attached to the package substrate; and the first photonic die is further disposed over the second electronic die, wherein the first photonic die is attached to a frontside of the second electronic die, such that the second electronic die is disposed between the first photonic die and the package substrate.

5. The package structure of claim 1, further comprising an optical fiber array connected to the first photonic die and the second photonic die.

6. The package structure of claim 1, wherein the first photonic die and the second photonic die each include a grating coupler.

7. The package structure of claim 1, wherein:

the thermally conductive material is a first metal nitride, wherein the first metal nitride includes a first metal; and the thermally conductive and electrically isolative material is a second metal nitride, wherein the second metal nitride includes a second metal different from the first metal, wherein the second metal is boron or aluminum.

8. The package structure of claim 1, wherein the first photonic die includes an optical compute region disposed between optical input/output regions.

9. A package structure comprising:

a photonic die configured as an optical bridge;

a first electronic die and a second electronic die, wherein the first electronic die includes an electronic device layer disposed between a frontside interconnect structure and a backside interconnect structure, wherein the backside interconnect structure is configured to deliver power to the electronic device layer;

a package component, wherein the photonic die, the first electronic die, and the package component are stacked top-to-bottom, the backside interconnect structure of the first electronic die is connected to the package component, and the photonic die is connected to the first electronic die and the second electronic die;

a thermally conductive and electrically isolative material disposed over the first electronic die and the second electronic die, wherein the thermally conductive and electrically isolative material is further disposed along sides of the photonic die; and a thermally conductive material disposed over the thermally conductive and electrically isolative material and the photonic die.

10. The package structure of claim 9, wherein the photonic die has a photonic device layer and a frontside interconnect structure, wherein the frontside interconnect structure of the photonic die is connected to the frontside interconnect structure of the first electronic die.

11. The package structure of claim 9, wherein the photonic die has a photonic device layer and a backside interconnect structure, wherein the backside interconnect structure of the photonic die is connected to the frontside interconnect structure of the first electronic die.

12. The package structure of claim 9, wherein the photonic die is a first photonic die and the package structure further includes:

a second photonic die stacked on top of and connected to the first electronic die; and the second photonic die is configured as an optical input/output, the first photonic die is disposed over a first edge of the first electronic die, and the second photonic die is disposed over a second edge of the first electronic die that is opposite the first edge.

13. The package structure of claim 12, wherein:

the thermally conductive and electrically isolative material is disposed between the first photonic die and the second photonic die; and the thermally conductive material is disposed over the first photonic die, the second photonic die, and the thermally conductive and electrically isolative material.

14. The package structure of claim 9, wherein the thermally conductive and electrically isolative material includes aluminum nitride.

15. The package structure of claim 9, wherein the thermally conductive and electrically isolative material includes boron nitride.

16. The package structure of claim 9, wherein the photonic die is a first photonic die and the package structure further includes:

a second photonic die stacked on top of and connected to the first electronic die;

a third photonic die stacked on top of and connected to the second electronic die; and the second photonic die and the third photonic die are configured as optical input/outputs and the first photonic die is disposed between the second photonic die and the third photonic die.

17. The package structure of claim 9, wherein the photonic die free of through semiconductor vias and the first electronic die and the second electronic die are free of through semiconductor vias.

18. A method comprising:

receiving a pair of photonic dies, wherein the pair of the photonic dies includes a first photonic die and a second photonic die;

receiving an electronic die having a backside power delivery structure;

attaching the first photonic die and the second photonic die of the pair of photonic dies to a frontside of the electronic die;

attaching the backside power delivery structure of the electronic die to a package component, wherein the pair of the photonic dies, the electronic die, and the package component are stacked top-to-bottom and the electronic die is between the first photonic die and the package component and between the second photonic die and the package component; and forming a first thermal structure between the first photonic die and the second photonic die and a second thermal structure over the first thermal structure, wherein the first thermal structure includes a thermally conductive and electrically isolative material, the second thermal structure includes a thermally conductive material, and the second thermal structure overlaps the first photonic die and the second photonic die.

19. The method of claim 18, wherein:

the attaching the first photonic die to the frontside of the electronic die includes bonding an interconnect structure of the first photonic die with a frontside interconnect structure of the electronic die using a first connection technique; and the attaching the backside power delivery structure of the electronic die to the package component includes bonding the backside power delivery structure of the electronic die with the package component using a second connection technique.

20. The method of claim 19, wherein the interconnect structure of the first photonic die is a backside interconnect structure, such that the first photonic die and the electronic die have a back-to-front bonding orientation.

* * * * *